US011521051B2

(12) United States Patent
Chang et al.

(10) Patent No.: US 11,521,051 B2
(45) Date of Patent: Dec. 6, 2022

(54) MEMRISTIVE NEURAL NETWORK COMPUTING ENGINE USING CMOS-COMPATIBLE CHARGE-TRAP-TRANSISTOR (CTT)

(71) Applicant: THE REGENTS OF THE UNIVERSITY OF CALIFORNIA, Oakland, CA (US)

(72) Inventors: Mau-Chung Frank Chang, Los Angeles, CA (US); Yuan Du, San Diego, CA (US); Li Du, La Jolla, CA (US)

(73) Assignee: THE REGENTS OF THE UNIVERSITY OF CALIFORNIA, Oakland, CA (US)

(*) Notice: Subject to any disclaimer, the term of this patent is extended or adjusted under 35 U.S.C. 154(b) by 387 days.

(21) Appl. No.: 16/876,063

(22) Filed: May 17, 2020

(65) Prior Publication Data
US 2020/0364548 A1 Nov. 19, 2020

Related U.S. Application Data

(63) Continuation of application No. PCT/US2018/061893, filed on Nov. 19, 2018.
(Continued)

(51) Int. Cl.
G06N 3/063 (2006.01)
G06N 3/04 (2006.01)
(Continued)

(52) U.S. Cl.
CPC ............. G06N 3/063 (2013.01); G06N 3/04 (2013.01); H01L 29/42344 (2013.01); H01L 29/792 (2013.01)

(58) Field of Classification Search
CPC ................................ G06N 3/04; G06N 3/063
See application file for complete search history.

(56) References Cited

U.S. PATENT DOCUMENTS 9,767,407 B2    9/2017  Cho
2013/0311413 A1* 11/2013  Rose ................... G06N 3/0635
                                              706/27
(Continued)

FOREIGN PATENT DOCUMENTS

WO       2019100036 A1    5/2019

OTHER PUBLICATIONS

ISA/US, United States Patent and Trademark Office (USPTO), International Search Report and Written Opinion dated Jan. 31, 2019, related PCT international application No. PCT/US2018/061893, pp. 1-9, claims searched, pp. 10-15.
(Continued)

Primary Examiner — Getente A Yimer
(74) Attorney, Agent, or Firm — O'Banion & Ritchey LLP; John P. O'Banion

(57) ABSTRACT

A neural network computing engine having an array of charge-trap-transistor (CTT) elements which are utilized as analog multipliers with all weight values preprogrammed into each CTT element as a CTT threshold voltage, with multiplicator values received from the neural network inference mode. The CTT elements perform computations of a fully connected (FC) neural network with each CTT element representing a neuron. Row resistors for each row of CTT element sum output currents as partial summation results. Counted pulse generators write weight values under control of a pulse generator controller. A sequential analog fabric (SAF) feeds multiple drain voltages in parallel to the CTT
(Continued)

array to enable parallel analog computations of neurons. Partial summation results are read by an analog-to-digital converter (ADC).

26 Claims, 16 Drawing Sheets

Related U.S. Application Data

(60) Provisional application No. 62/588,716, filed on Nov. 20, 2017.

(51) Int. Cl.
    *H01L 29/423*      (2006.01)
    *H01L 29/792*      (2006.01)

(56) References Cited

U.S. PATENT DOCUMENTS

| | | | |
|---|---|---|---|
| 2017/0083811 A1* | 3/2017 | Cho | G11C 13/0002 |
| 2017/0329575 A1* | 11/2017 | Gu | G06F 7/023 |
| 2019/0220742 A1* | 7/2019 | Kuo | G06N 3/063 |
| 2022/0130900 A1* | 4/2022 | Terasaki | G06N 3/063 |

OTHER PUBLICATIONS

Du, Yuan et al., A Memristive Neural Network Computing Engine using CMOS-Compatible Charge-Trap-Transistor (CTT), arXiv:1709.06614, online Sep. 19, 2017.

Du, Li et al., "A Reconfigurable Streaming Deep Convolutional Neural Network Accelerator for Internet of Things", IEEE Circuits and Systems I: Regular Papers, vol. 65, Issue: 1, Jan. 2018, published online Jul. 8, 2017.

\* cited by examiner

310

MEMRISTIVE NEURAL NETWORK COMPUTING ENGINE USING CMOS-COMPATIBLE CHARGE-TRAP-TRANSISTOR (CTT)

CROSS-REFERENCE TO RELATED APPLICATIONS

This application claims priority to, and is a 35 U.S.C. § 111(a) continuation of, PCT international application number PCT/US2018/061893 filed on Nov. 19, 2018, incorporated herein by reference in its entirety, which claims priority to, and the benefit of, U.S. provisional patent application Ser. No. 62/588,716 filed on Nov. 20, 2017, incorporated herein by reference in its entirety. Priority is claimed to each of the foregoing applications.

The above-referenced PCT international application was published as PCT International Publication No. WO 2019/100036 on May 23, 2019, which publication is incorporated herein by reference in its entirety.

STATEMENT REGARDING FEDERALLY SPONSORED RESEARCH OR DEVELOPMENT

Not Applicable

INCORPORATION-BY-REFERENCE OF COMPUTER PROGRAM APPENDIX

Not Applicable

NOTICE OF MATERIAL SUBJECT TO COPYRIGHT PROTECTION

A portion of the material in this patent document may be subject to copyright protection under the copyright laws of the United States and of other countries. The owner of the copyright rights has no objection to the facsimile reproduction by anyone of the patent document or the patent disclosure, as it appears in the United States Patent and Trademark Office publicly available file or records, but otherwise reserves all copyright rights whatsoever. The copyright owner does not hereby waive any of its rights to have this patent document maintained in secrecy, including without limitation its rights pursuant to 37 C.F.R. § 1.14.

BACKGROUND

1. Technical Field

The technology of this disclosure pertains generally to neural networks, and more particularly to a memristive neural network computing engine.

2. Background Discussion

Deep learning using convolutional and fully connected neural networks has achieved unprecedented accuracy on many modern artificial intelligence (AI) applications, such as image, voice, and DNA pattern detection and recognition. However, one of the major problems that has hindered its commercial feasibility, is that neural networks require a large number of computation resources even for performing very simple tasks. State-of-the-art digital computation processors such as CPU, GPU or DSP in embedded the system-on-chip (SoC) systems are unable to meet the required computational throughput within the strict power and cost constraints in many practical applications.

In addition to the above limitation, most modern computational processors are implemented based on a Von-Neumann architecture. With the limitation of transistor technology scaling, the computational throughput using current architectures will inevitably reach a saturation point because of transistor scaling physical limits. Recent research reports the development of analog computing engines. Compared to traditional digital computation, analog computing shows tremendous advantages regarding power, design cost and computation speed. Among many of them, memristor-based analog computing has been widely reported, and various memristive devices have been demonstrated. However, these devices require the introduction of new materials or extra manufacture processes, which are not currently supported in major CMOS foundries. Thus, they cannot be embedded into commercial CMOS integrated circuits (chips).

Accordingly, a need exists for new memristor neural devices which provide area and power reductions. The present disclosure fulfills that need and provides additional benefits over previous technologies.

BRIEF SUMMARY

A memristive neural network computing engine based on CMOS-compatible charge-trap transistor (CTT) is described in this disclosure. CTT devices are used as analog multipliers. Compared with digital multipliers, a CTT-based analog multiplier shows dramatically area and power reduction (greater than 100×). The described memristive computing engine is composed of a scalable CTT multiplier array and energy efficient analog-digital interfaces. Through implementing the sequential analog fabric (SAF), the engine's mixed-signal interfaces are simplified and hardware overhand remains consistent with increasing array element number. A proof-of-concept 784 by 784 CTT computing engine is implemented using TSMC 28 nm CMOS technology and occupied 0.68 mm². It achieves 76.8 TOPS with 500 MHz clock frequency and consumes 14.8 mW. As an example, we utilize this memristive computing engine to address a classic pattern recognition problem, which is the classifying of handwritten digits from the MNIST database and which obtained a performance comparable to state-of-the-art fully connected neural networks using 8-bit fixed-point resolution.

Further aspects of the technology described herein will be brought out in the following portions of the specification, wherein the detailed description is for the purpose of fully disclosing preferred embodiments of the technology without placing limitations thereon.

BRIEF DESCRIPTION OF THE SEVERAL VIEWS OF THE DRAWING(S)

The technology described herein will be more fully understood by reference to the following drawings which are for illustrative purposes only:

DETAILED DESCRIPTION

1. Introduction

A memristive computing engine is described in this disclosure which is based on a Charge-Trap Transistor (CTT). By way of example and not limitation, the described memristive computing engine is composed of an array of 784 by 784 CTT analog multipliers and achieves 100× power and area reduction compared with regular digital computation. It will be appreciated that the computing engine may be scaled as desired without departing from the teachings of the present disclosure.

The present disclosure leverages recent announcements of charge-trap transistor (CTT) being utilized as digital memory devices using an error-proof trapping and de-trapping algorithm. Memristive devices based on charge-trapping phenomena include floating-gate transistors, transistors with an organic gate dielectric, and carbon nanotube transistors. However, none of these proposals were both fully CMOS-compatible in terms of process and operating voltage and manufacture maturity level. The charge-trapping phenomenon in a transistor with high-k-metal gate has traditionally been considered as reliability concern, causing bias temperature instability, and other issues. But it was recently discovered that with a drain bias during the charge-trapping process, many more carriers can be trapped in the gate dielectric very stably, and more than 90% of the trapped charge can be retained after 10 years even when the device is baked at 85° C.

More interestingly, an analog synapse vector was demonstrated to execute unsupervised learning computation. However, the demonstrated analog synapse vector only includes nine neurons, which is limited to perform any practical neural network computation and it did not consider the analog and digital interfaces, which will be the main energy consumption in memristor-based neuromorphic computing applications.

The present disclosure makes advantageous use of CTT technology in creating a memristive neural network computing engine, which operates the CTT transistors in an analog regime, within a device structure which increases both areal and power efficiencies, and which can be implemented in existing process technologies (e.g., Complementary Metal-Oxide Semiconductor (CMOS)).

Figure 1:
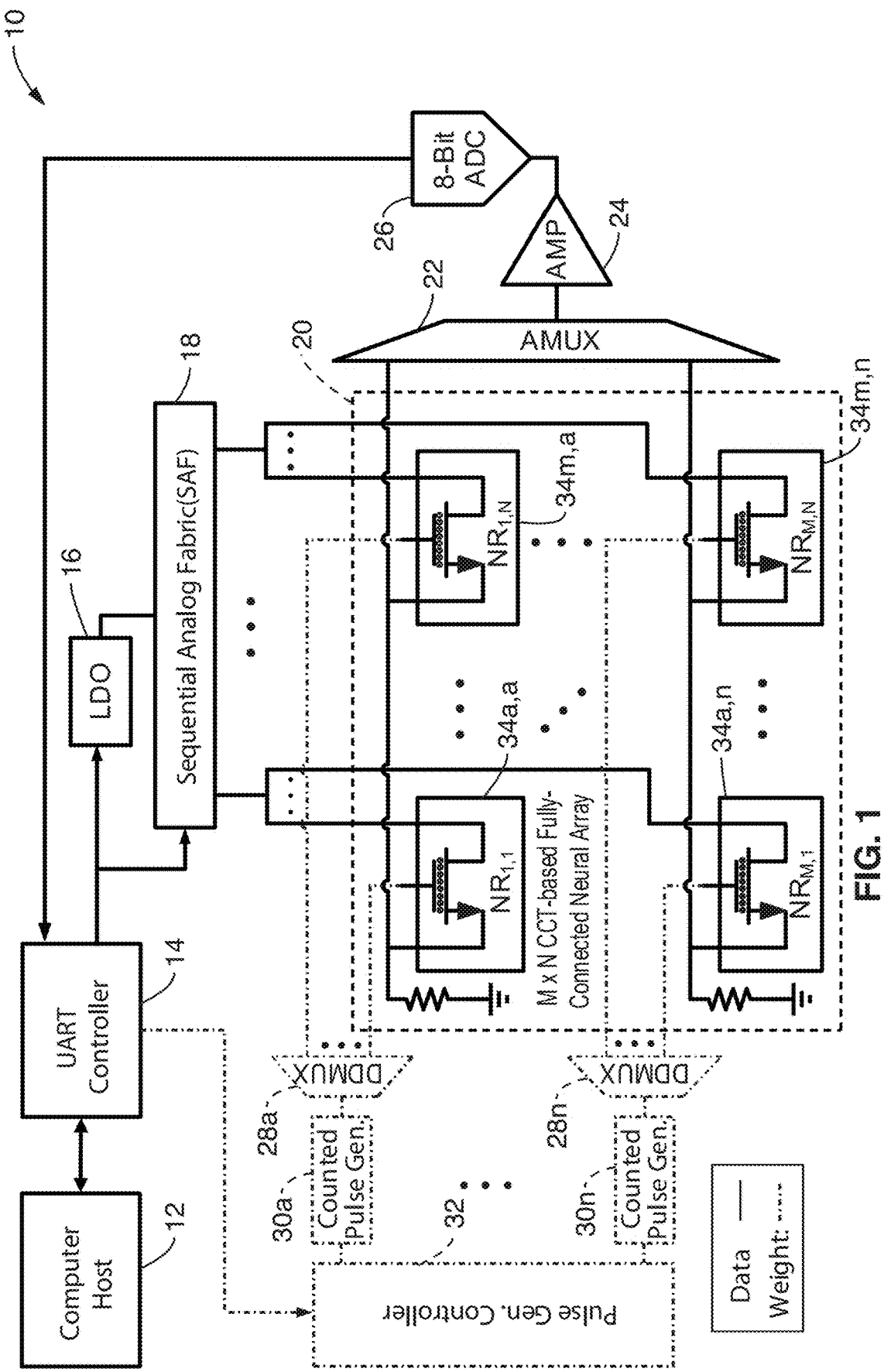
FIG. 1 is a block diagram of a memristive neural network computing engine according to an embodiment of the present disclosure.

FIG. 1 illustrates an example embodiment 10 of a top-level system architecture for the memristive computing engine. The memristive computing engine is shown including CTT array 20, mixed-signal interfaces including tunable Low-dropout regulator (LDO) 16, analog-to-digital converter (ADC) 26, and novel sequential analog fabric (SAF) 18.

Through implementing a novel sequential analog fabric (SAF) 18, the mixed-signal analog-to-digital interfaces are simplified and the computing engine requires only a single analog-to-digital converter (ADC) (e.g., an 8-bit ADC) in the system. The figure depicts a computer host 12 coupled to a Universal Asynchronous Receiver-Transmitter (UART) controller 14 for controlling elements of the computing engine. The computer host communicates through the UART to control a programmable Low Dropout regulator 16, a Sequential Analog Fabric (SAF) 18 and a pulse generating controller 32, as well as for receiving digital data from ADC 26 reading the CTT array output passing through analog multiplexor (AMUX) 22 and amplifier 24. The pulse generating controller is shown for controlling the weighting of CTT array 20 through a series of counted pulse generators 30a through 30n, which are each coupled to a digital demultiplexor (DDMUX) 28a through 28n, respectively. The CTT array 20 is exemplified as a two dimensional array [M×N] of CTT cells whose corner cells are depicted as CTT cells 34aa, 34ma, 34an and 34mn. The structures of this memristive computing engine are discussed in additional detail in later sections.

A few of the benefits of this memristive neural network computing engine include the following. (1) A parallel (e.g., 8-bit 784×784) fully connected neural network (FCNN) memristive computing engine, using CTT-based analog multipliers having a structure that achieves significant area and power reductions compared to the use of a conventional digital computing engine. (2) A memristive neural network computing engine architecture providing area and energy efficient analog-digital interfaces that are configured to flexibly store, calibrate or re-process inter-layer partial calculation results to guarantee analog computation accuracy. (3) A sequential analog fabric (SAF) is disclosed which simplifies the interfaces between the analog and digital domain, such as by eliminating the need for digital-to-analog conversion (DAC) and enabling the parallel computation of multiple neurons. (4) An architecture that has been tested with a practical application, handwritten digits recognition, using different configurations of multilayer neural network structure, which is well simulated and analyzed based on single device experimental data over MNIST dataset. (5) A number-of-bit resolution requirement studies has been performed on the memristive neural network computing engine indicating that resolution using a 8-bit fixed-point data format is generally sufficient to achieve similar performance, compared with that of a 32-bit floating-point data format, showing a result difference of less than 2%.

2. Charge-Trap-Transistor Device Introduction 2.1. CTT Basics

Charge-trapping phenomenon is a well-known effect in Flash memories devices. However, it is not preferred for high-performance logic or low-cost foundry technologies due to additional mask or process complexity and voltage incompatibility. The present disclosure describes and models a fully logic-compatible CTT, for example as measured in 22 nm planar and 14 nm FinFET technology platforms without added process complexity or masks. This CTT provides enhanced and stabilized charge-trapping behavior, which may be exploited in their use herein as basic analog computing elements.

N-type CTTs, such as having an interfacial layer (IFL) of $SiO_2$ followed by an $HfSiO_x$ layer as the gate dielectric, is a common material choice in state-of-the-art CMOS technologies. It should be noted that, although the disclosed CTT is demonstrated only on planar Silicon-On-Insulator (SOI) devices, the mechanisms apply to bulk substrates of FinFETs, and can be extended to other technologies as well.

FIG. 2A through FIG. 2D illustrate basic operation of a CTT device, showing operation 50, 90 and associated plots 70, 100. It should be appreciated that the elements of the CTT device may also be implemented as a FinFET based CTT.

Figure 2B:
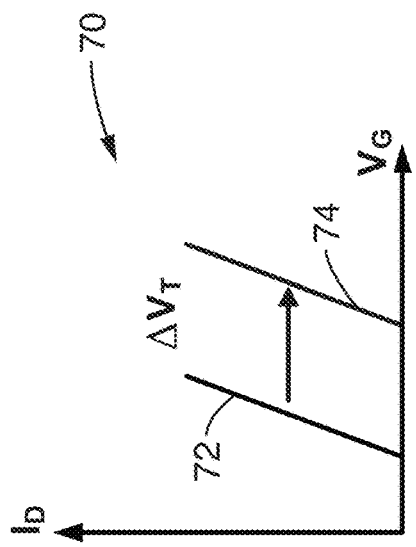
FIG. 2A through FIG. 2D are schematics and associated plots showing basic operation of a Charge-Trap Transistor (CTT) device according to an embodiment of the present disclosure.
Figure 2A:
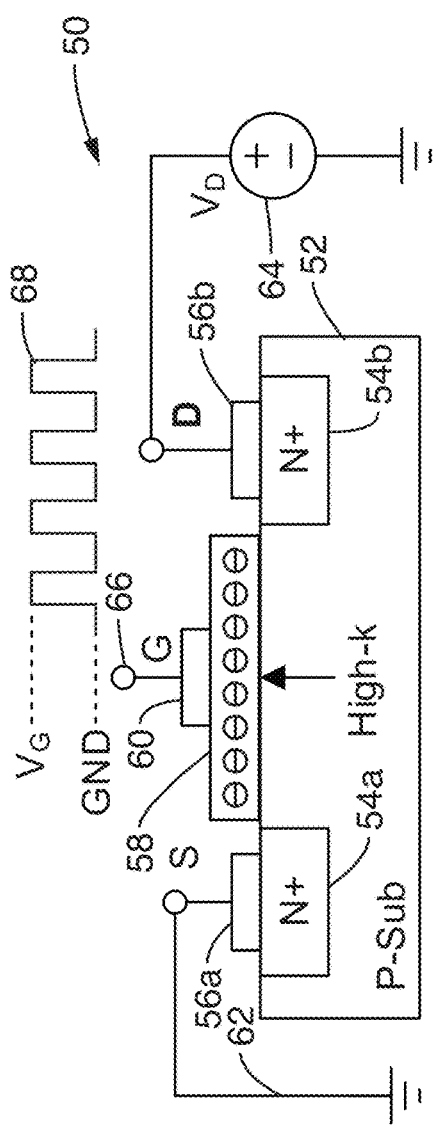
Figure 2D:
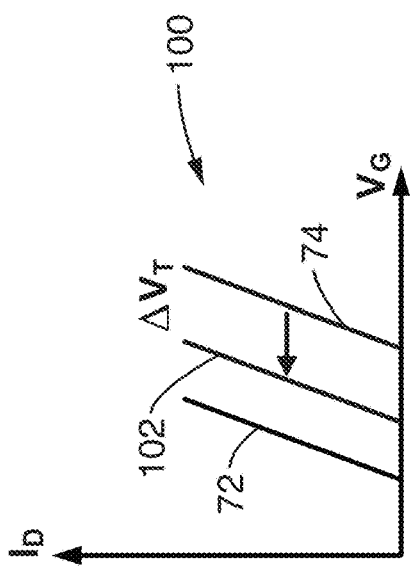
Figure 2C:
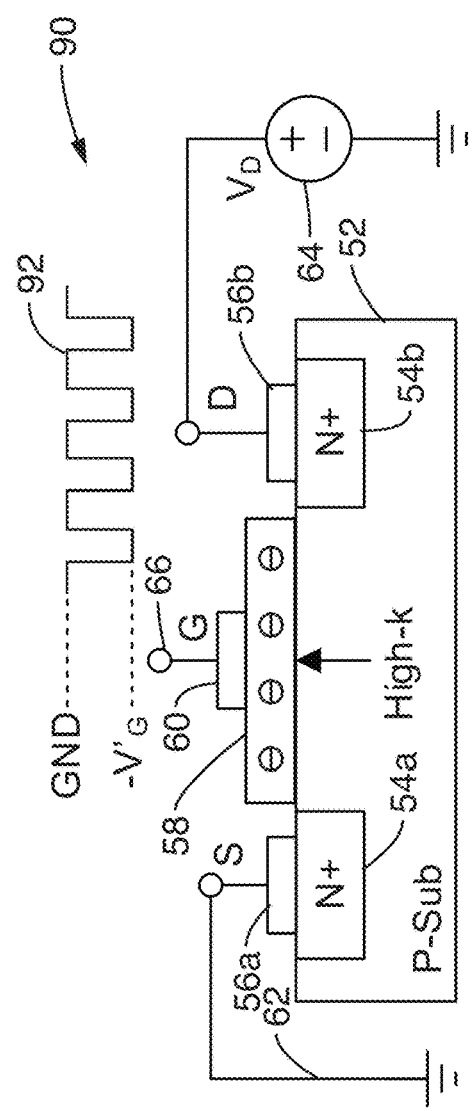

FIG. 2A illustrates 50 the charge trapping operation, while FIG. 2C illustrates 90 the charge de-trapping operation. In these figures the device structure is seen with a P-substrate 52 having N+ wells 54*a*, 54*b*, over which are disposed source and drain contacts 56*a*, 56*b*, between which is disposed a high-k (high dielectric constant) dielectric 58 having at least one gate contact 60. The source is seen coupled to ground 62, while the drain is seen coupled to a voltage source $V_D$ 64, which is set to a positive value $V_{trap}$ such as approximately 2 V in this example, for trapping and to $V_{detrap}$, such as approximately zero volts during de-trapping.

In FIG. 2A a positive signal (between $V_G$ and ground) 68 (e.g., square wave) is seen applied to the gate when performing the charge trapping operation, while in FIG. 2B a negative signal (between ground and $-V_G$) is applied to the gate to perform charge de-trapping. The device threshold voltage $V_T$ is modulated by the charge trapped in the gate dielectric of the transistor. To understand the dynamic behavior of charge trapping, the example shows in FIG. 2A an application of a pulse train 68 at the gate terminal of CTT device, and then the VT change is measured as a function of applied pulse number, as seen in FIG. 2B illustrating 70 dynamic behavior with the threshold moving from position 72 to parallel position 74. Then in FIG. 2C application of a pulse train 92 is seen coupled to the gate terminal of CTT device with $V_T$ change measured as a function of applied pulse number, as seen in FIG. 2D illustrating 100 the threshold moving back from position 74 to an intermediate position 102.

CTT devices can be programmed by applying microsecond (µs) long trapping (positive) and de-trapping (negative) pulses on the gate to modify the threshold voltage of the transistor. By way of example and not limitation, pulses of approximately 2 volts (V) were applied to the gate during charge trapping operation with approximately a 1.3 V drain voltage, then during a charge de-trapping operation, pulses of approximately −1.3 V were applied to the gate with the drain held at approximately 0 V. It should be appreciated that programming efficiency is highest at the beginning of the program operation and reduces with increasing programming time as more and more of the available electron traps are filled.

A drain bias enhances and stabilizes the charge-trapping process. The trapped charge dissipates very slowly (approximately 8 years at 85° C.), allowing the devices to be used for embedded nonvolatile memory. In addition, the CTT devices are attractive in that they have a very low energy consumption per synaptic operation, which for example is reported at the pico-joule level. Furthermore, because the disclosed CTTs can be readily implemented, such as based-on commercial standard NMOS transistors, the process variation is well-controlled and capable of providing a high yield rate. It can be beneficial for example to utilize a large number of the disclosed CTTs based on mature fabrication processes to build large-scale analog computing engines, compared with relying on other memristive computing technologies whose process flows are just emerging.

2.2. CTT-Based Multiplication

For most current neuromorphic networks, the training and inference operations generally heavily rely on vector or matrix multiplication in both feedforward and error back-propagation computation. It should be appreciated that the science of neuromorphic computing describes the use electronic circuits to mimic neuro-biological architectures present in the nervous system.

Figure 3A:
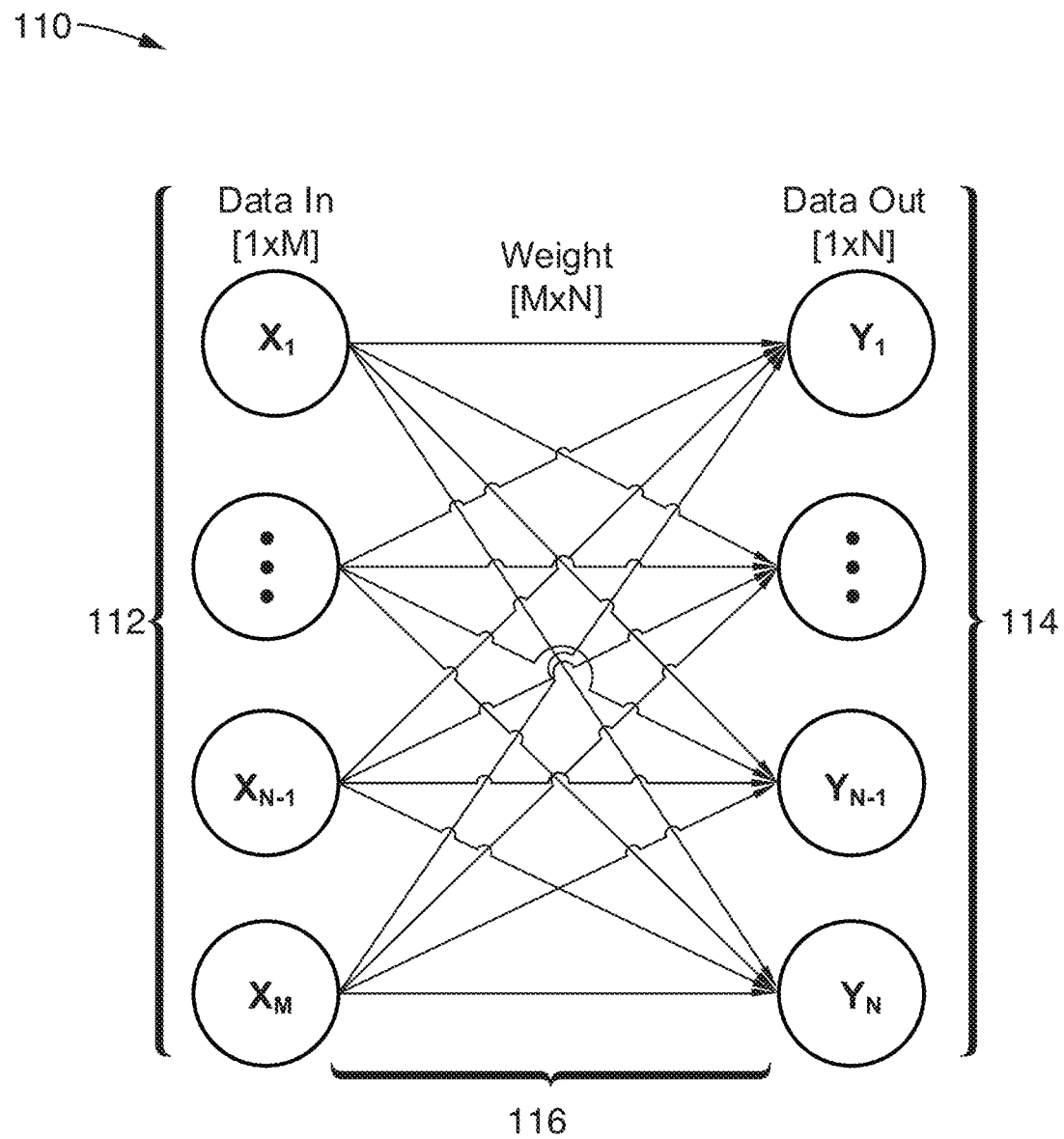
FIG. 3A and FIG. 3B are block diagrams of a fully-connected neural array and a Charge-Trap Transistor (CTT) multiplication array configured according to an embodiment of the present disclosure.

FIG. 3A illustrates an example embodiment 110 of an M-by-N fully connected neural network, or so-called fully connected layer, in which $X_i$ is the input data 112 ($X_i$, ... $X_{N-1}$, $X_M$), and $Y_i$ are the output results 114 ($Y_i$, ... $Y_{N-1}$, $Y_M$). Output results and input data are connected by weighted M by N matrix 116. Each output is determined by Equation (1):

$$Y_i = \sum_{j=1}^{N} X_i \cdot W_{i,j} \qquad (1)$$

where $W_{i,j}$ is the weight coefficient between the input neuron i and the output neuron j.

The precise programmability of threshold voltages for the CTT cells enable the possibility of storing weight values locally and performing analog multiplication when a CTT is biased in triode region as shown in Eq. (2):

$$I_D = \frac{1}{2} k_n \frac{W}{L} \left[ 2V_{DS}(V_{GS} - V_T) - V_{DS}^2 \right] \approx k_n \frac{W}{L} V_{DS}(V_{GS} - V_T) \qquad (2)$$

when $v_{DS} < v_{GS} - v_{tn}$.

Figure 3B:
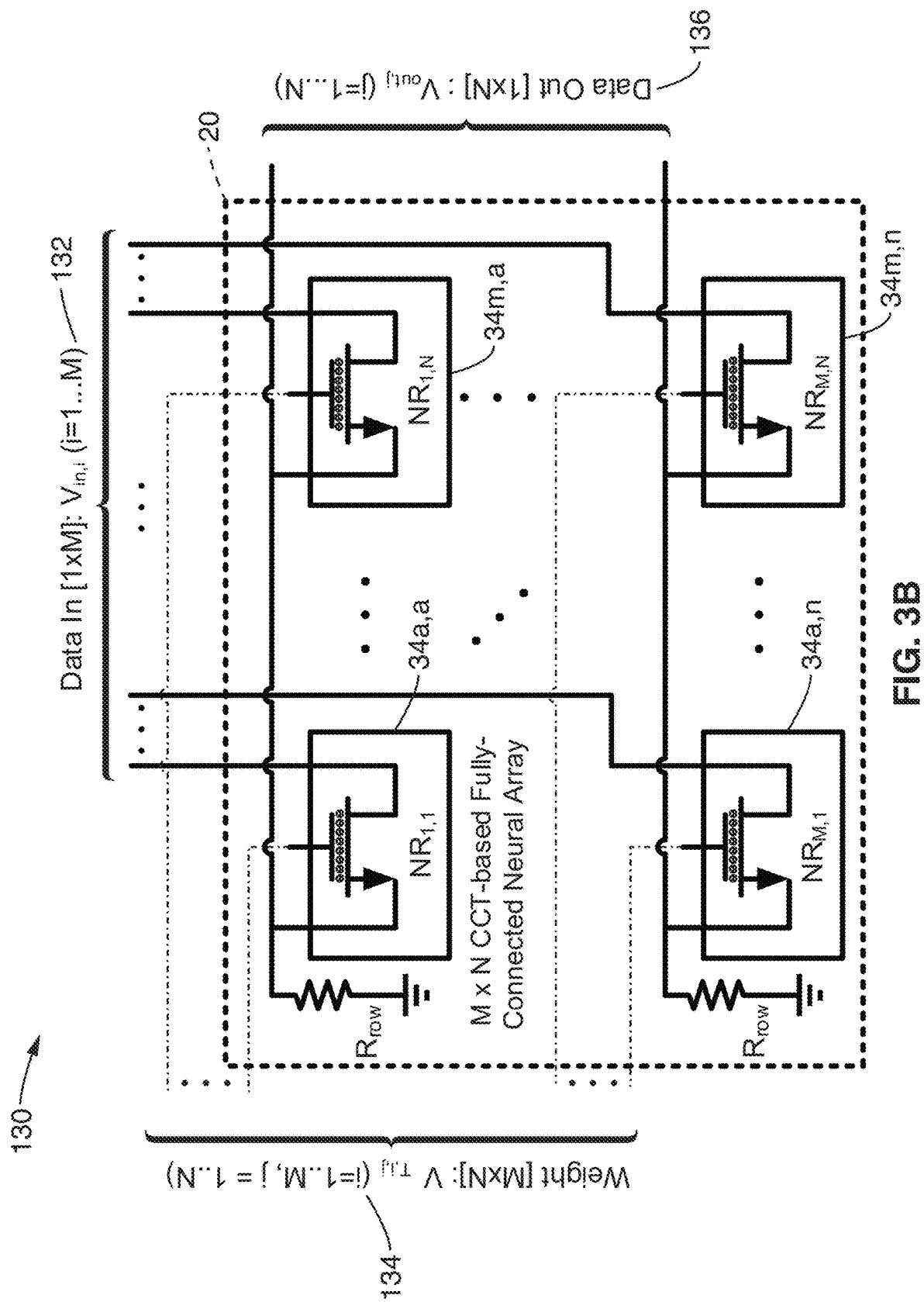

FIG. 3B illustrates an example embodiment 130 of an M-by-N CTT multiplication array, which implements all the necessary computation of an M-by-N fully connected (FC) neural network. Data in 132 is seen as [1×M]: $V_{in,I}$ (i=1 ... M). All the weight values 134 are input to the CTT array, which are seen as Weight [M×N]: $V_{T,I}j$ (i=1 ... M, j=1 ... N), that are preprogrammed into each CTT element ($NR_{i,j}$), with four corners of the array seen in the figure as 34*aa*, 34*ma*, 34*an* and 34*mn*. $V_T$ of each transistor in the CTT array can be programmed by a number of pulses of positive-trapping or negative-de-trapping pulse trains. Due to the fast-reading and slow-writing nature of CTT $V_T$ programmability, it is unique to store weights in the CTT threshold voltage and provide multiplicator values in the neural network inference mode, which does not require rapid change of weight values once they are programmed from the pre-trained model.

While $V_T$ stores the weight value, the input data value is fed to $V_{DS}$ by a voltage reference source. $V_{GS}$ in Eq. (2) is a fixed value during operation to satisfy triode region conditions. Output currents of each CTT element are summed in row resistors. If the input data values were available at the same time, all the calculated output data 136, seen as Data Out [1×N]: $V_{out,j}$ (j=1 . . . N), would be ready within one clock cycle. The voltages across row resistors can be calculated by the following equations:

$$V_{out,j(j=1...N)} = R \cdot \sum_{i=1}^{M} I_{D,i,j} \quad (3)$$

$$V_{out,j(j=1...N)} = R \cdot k_n \cdot \frac{W}{L} \sum_{i=1}^{M} V_{DS,i,j}(V_{GS} - V_{T,i,j}) \quad (4)$$

$$V_{out,j(j=1...N)} = R \cdot k_n \cdot \frac{W}{L} \sum_{i=1}^{M} V_{DS,i,j} V_{T,i,j} - f(V_{DS,i,j}) \quad (5)$$

In the above equations, $V_{out,j}$ represents the output of $Y_j$ neural cell at Row j, $V_{DS,i,j}$ is transferred from input image pixel value and $V_{T,i,j}$ is programmed by pulse number based on a pre-trained model $W_{i,j}$ value. As shown in Eq. (5), the right side of the equation is separated into two terms. The first term is the wanted multiplication results while the second term is an unwanted input-data-dependent offset. Fortunately, the input data is known in the system and the offset can then be easily calibrated out in the digital domain following conversion to digital at the analog-to-digital converter.

3. System-Level Architecture
3.1. System-Level Considerations

Table 1 compares conventional digital domain computation by summarizing energy consumption and area occupation of 8-bit to 32-bit Multiply-Accumulate (MAC) operations in TSMC 40 nm technology node. All the values in the table refer to previous research work, based on traditional digital computation, rather than CTT computation. The FP stands for floating-point with more dynamic range and other rows without FP is fixed point.

Compared with the standard digital MAC operations, energy consumption per multiplication operation of a single CTT device is one order lower than its 32-bit floating-point digital counterpart. For area occupation, it was determined that the disclosed CTT-based computation offers an area reduction of more than 100 times (two orders of magnitude). One 8-bit MAC requires approximately 100~400 transistors while one CTT-based MAC only needs single CTT transistor. However, an analog-digital interface conversion circuitry is required for analog computing which adds to the system's overall power consumption.

Although the disclosed CTT technique is promising for achieving low-power, high-performance matrix computation in parallel, there are three important areas that should be addressed toward putting CTT-based computation techniques into practice. (1) An efficient interface should be preferably provided between the analog and digital domain that enables fast and easy data format transfers between the analog and digital domain. (2) A scalable and reconfigurable array is preferably provided which computes parallel multiple neuron values simultaneously. (3) A robust training and inference algorithm is preferably provided which tolerates nonlinearity, process variations and other computing uncertainties.

3.2. Top-Level System Architecture

Toward addressing the above-mentioned issues, the following describes a CTT-based array architecture for efficient fully-connected layer computation, such as seen in FIG. 1, for example comprising a 784 by 784 CTT multiplier array, mixed-signal interfaces including a tunable Low-dropout regulator (LDO), an analog-to-digital converter (ADC), and novel sequential analog fabric (SAF) to assist parallel analog computing.

In at least one embodiment, the number of array elements is scalable, while mixed-signal interface hardware overhead is almost constant. The system is configured so that intermediate data can be stored in any type of on-chip/off-chip memory. In the proof-of-concept prototype, the inter-layer data is stored in PC memory through a UART interface, however, it will be appreciated that it may be stored in other ways without limitation.

It is an important feature that the sequential analog fabric array block feeds multiple drain voltages in parallel using only one voltage reference. While a single 8-bit ADC can be utilized to read out the partial summation results from each row. The detailed design of key building blocks are be discussed in the next section.

4. Building Block Designs and Operations
4.1. Design of Key Building Blocks
4.1.1. Sequential Analog Fabric A sequential analog fabric (SAF) is implemented in the neural computation engine to enable parallel analog computations of multiple neurons. When a set of input neurons are fed into the sequential analog fabric, the fabric first transfers data from each of the parallel input bits into a sequence. Then each bit for the neurons is sent out to the analog switches in sequence to turn on/off the corresponding CTT multipliers. The computed results of each analog multiplier is summed at the row resistors and sampled at the ADC input. In at least one embodiment, each bit of computation requires a single clock cycle. The output of different bits is accumulated together in the digital domain following ADC sampling. For the exemplified 8-bit data format, eight clock cycles are utilized to complete a fully connected multiplication for one array.

Figure 4:
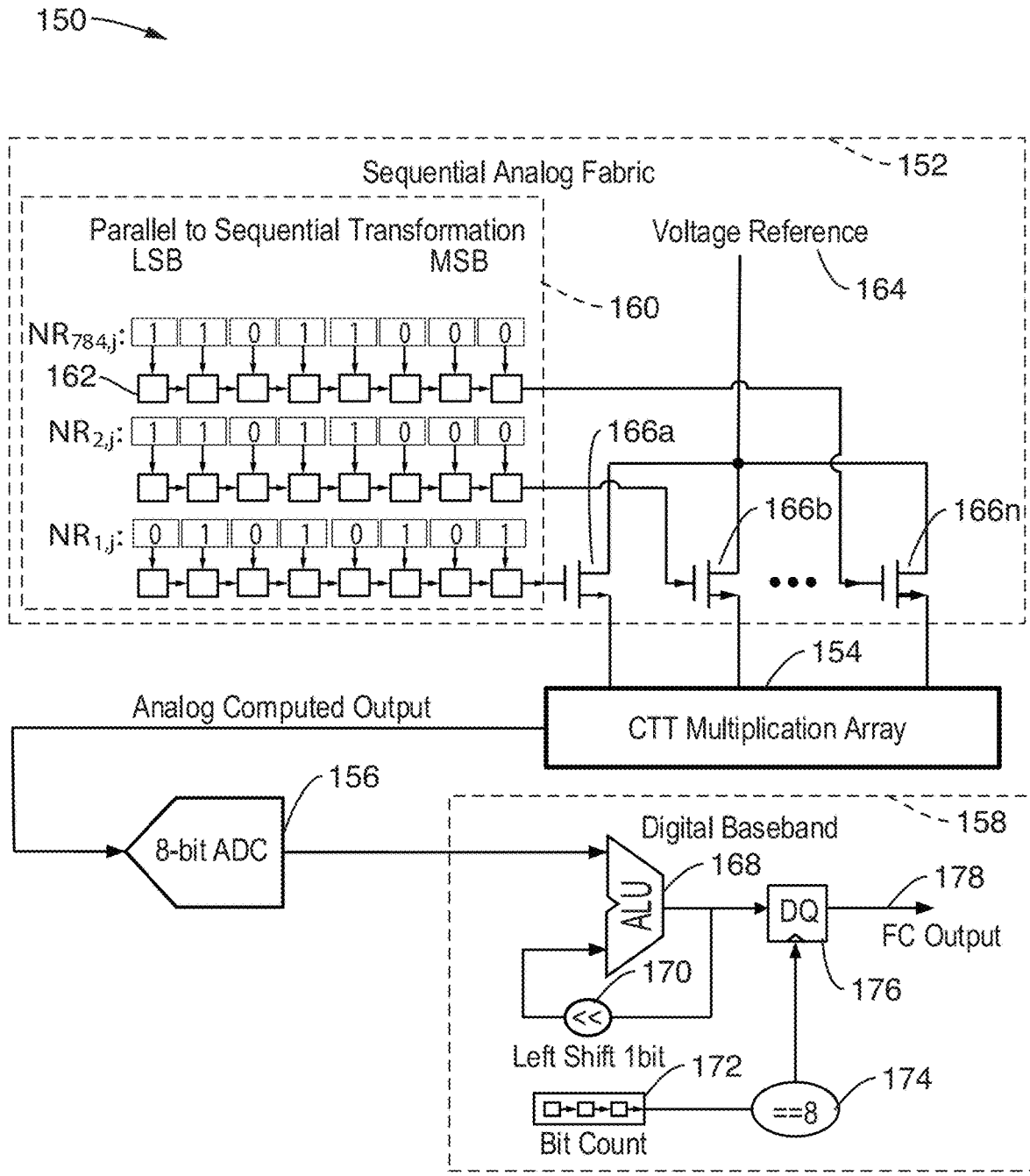
FIG. 4 is a schematic diagram of a Sequential Analog Fabric (SAF) according to an embodiment of the present disclosure.

FIG. 4 illustrates an example embodiment 150 of Sequential Analog Fabric (SAF) 152, connected to a CTT multiplication array 154 whose analog computed output is directed to an analog-to-digital converter (ADC) 156 (e.g., an 8 bit ADC by example and not limitation), whose output reaches a stage 158 which performs digital baseband operations. The SAF is shown comprising a parallel to sequential transformation section 160 with bits 162 seen spanning ADC width (e.g., 8 bits for this example) for each of the CTT elements in the array. The sequential outputs from sequential transformation section 160 control switches 166a, 166b, . . . , 166n (e.g., MOSFETs or other switching elements), from a voltage reference 164. The digital baseband processing is seen being performed with arithmetic logic unit (ALU) 168, shifter 170, a flip-flop (FF) 176 (e.g., D FF), which is clocked by a modulo 8 detector 174 when driven by bit counter 172. It will be noted that the digital processing can be performed by digital processors, or digital logic circuitry, or any desired combination of processors and digital logic circuitry.

The switch size of the analog fabric is carefully tuned to maintain a low on-resistance ($R_{ON}$), for example at less than approximately 20 ohms, toward simplifying pre-amplifier design without limiting overall computational accuracy.

Since only 1-bit of each neuron is sent out to the multiplication array, the drain node side of each CTT is either a fixed voltage or floating. This results from using a voltage reference 164 (e.g., Low Drop Out (LDO) regulator) which is constant. Thus, the nonlinearity introduced by the $V_{DS}$ becomes a constant offset in the computation. Compared with regular analog computing, no digital-to-analog converter (DAC) is required to generate multi-level input voltages for the CTTs array. In addition, since the applied voltage is constant, the required dynamic range of the sampled ADC is also reduced.

Besides mixed signal interface reduction, the analog fabric also improves computing engine performance through enabling the data from parallel neurons to be simultaneously fed into the array of CTT multipliers. As the input drain voltage to each multiplier is fixed, only a single switch is required to turn on/off the multiplier based on the current input bit value.

4.1.2. Analog-to-Digital Converter (ADC)

Figure 5:
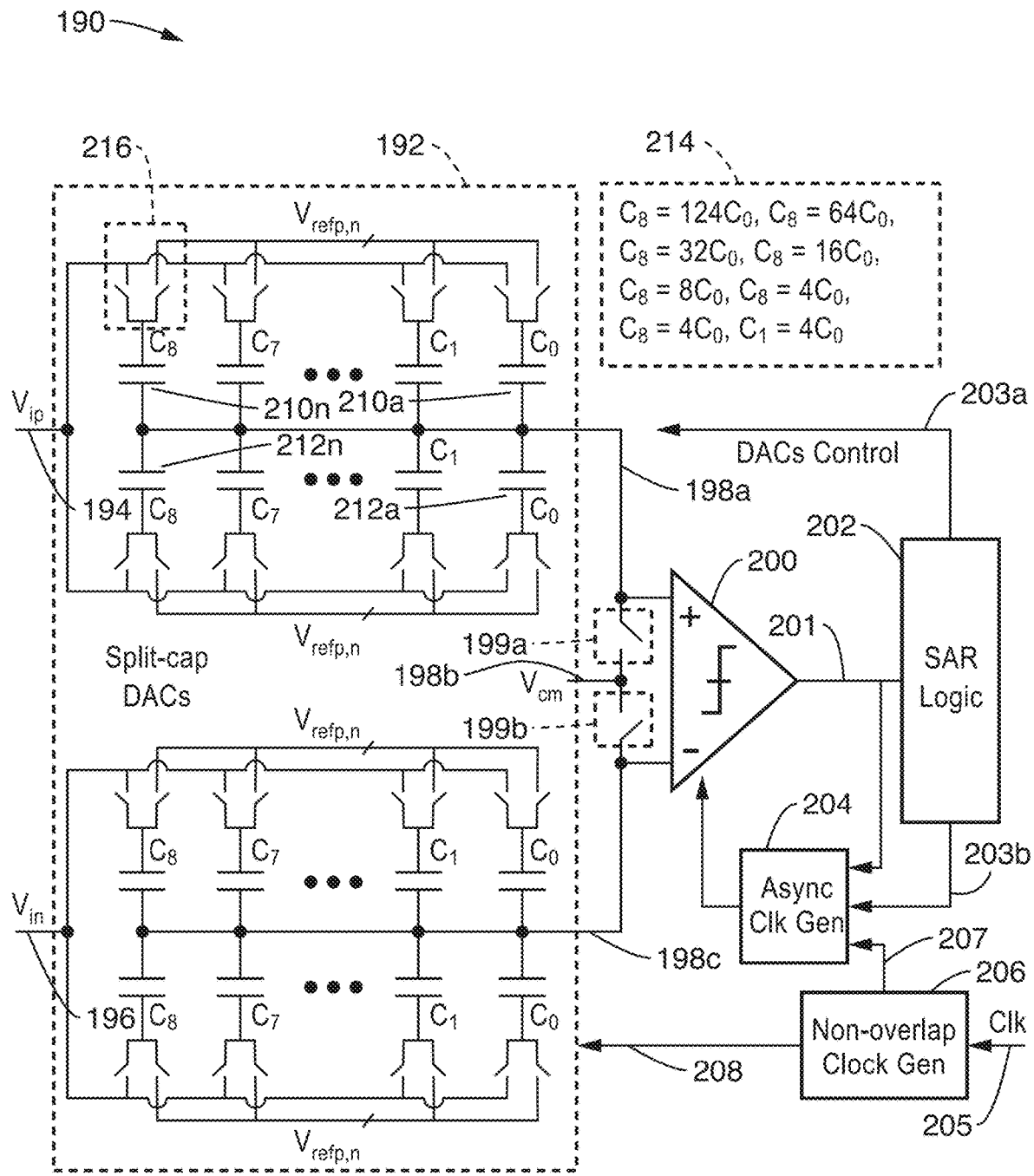
FIG. 5 is a schematic diagram an 8-bit low power SAR ADC block according to an embodiment of the present disclosure.

FIG. 5 illustrates an example embodiment 190 of an analog-to-digital converter (ADC), as seen in FIG. 1 ADC 26, that can be utilized in the present disclosure to quantify the computed result of the CTT multiplication array. By way of example and not limitation, this 8-bit low power Successive Approximation Register (SAR) ADC, achieves improved power and/or speed performance in comparison with its synchronous structure counterparts, while not requiring the distribution of multiple phase-matched ADC clocks.

The SAR ADC is configured for connecting to the output of the amplifier, as seen as amplifier 24 in FIG. 1, to sense the computed analog voltage received as differential signals $V_{ip}$ 194 and $V_{in}$ 196. To improve the efficiency, the SAR ADC uses sub-radix and two-capacitor DACs to provide over-range protection to capacitor mismatch and to insufficient settling at the expense of one more conversion cycle. Two banks of split capacitor (Split-cap) DACs are seen utilized in DAC block 192. Each bank of split capacitor DACs comprises two series of capacitors, seen as capacitors 210a through 210n and 212a through 212n, having one side in common providing outputs 198a, 198c, which connects to inputs of comparator 200. Each of the second sides of the capacitors of the bank of split capacitors is coupled to a pair of switches 216, that allow connecting the capacitors to either the input $V_{ip}$ 194 or $V_{in}$ 196 for the lower bank, or to a reference voltage $V_{refp,n}$.

Comparator 200 is seen with switches 199a, 199b at its input allowing coupling either input to $V_{cm}$ 198b. Comparator output 201 is input to SAR logic 202, having outputs 203a to control the DACs, and output 203b which is utilized by an asynchronous clock generator 204, along with a clock signal 207 and comparator output 201 to control comparator latching 209. Clock signal 207 is generated from a non-overlapping clock generator circuit 206, which received clock 205 and outputs clock signals 207 and 208.

Figures 6A, 6B:
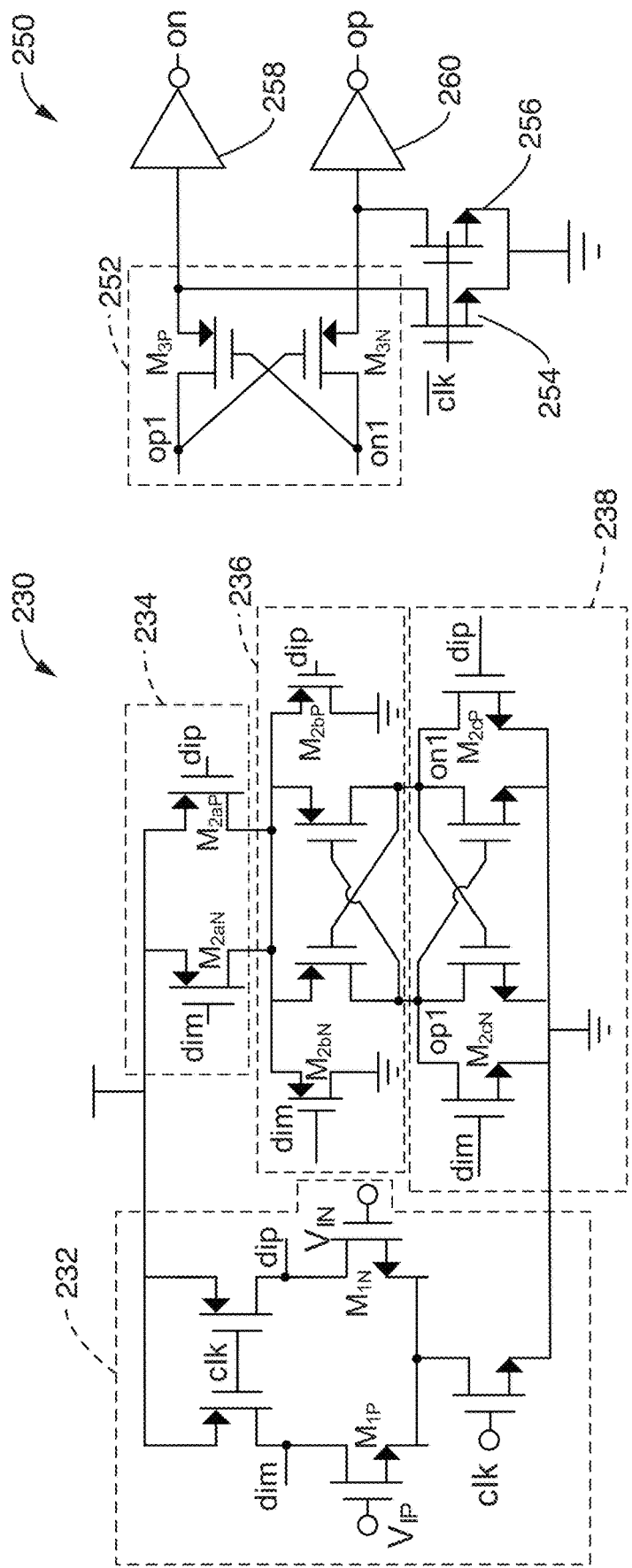
FIG. 6A and FIG. 6B are a schematic diagram of a comparator block utilized according to an embodiment of the present disclosure.

FIG. 6 illustrates an example embodiment 230, 250 of a comparator using a double-tail latching topology. An integrator stage 232 is seen including transistors M1P/M1N followed by a stage comprising three parallel differential pairs 234 (M2aP/M2aN), 236 (M2bP/M2bN), and 238 (M3bP/M3bN). A circuit is shown 250 having a regenerative latch 252 (M3P/M3N) to accommodate a low supply voltage (e.g., ~1V). The latch reset differential pairs 254, 256 aid in minimizing regeneration time by minimizing device capacitances. When the clock (clk) is low, the nodes dip and dim are reset to the supply voltage while the outputs op1 and on1 are discharged to ground. When the clock (clk) goes high, dip and dim begin discharging to ground while the differential input signal $V_{IP}$ and $V_{IN}$ are being integrated and amplified to dip-dim. When dip or dim is sufficiently low to turn on M2aN or M2aP, then regeneration is triggered. A small differential-pair injecting correction current is added at the latch input for offset calibration, instead of a capacitive load of input transistors, because the heavy capacitive load increases integration time which would adversely impact speed. Output from latch 252 is seen driving inverters 258, 260.

4.2. Operation Procedure

Figure 7:
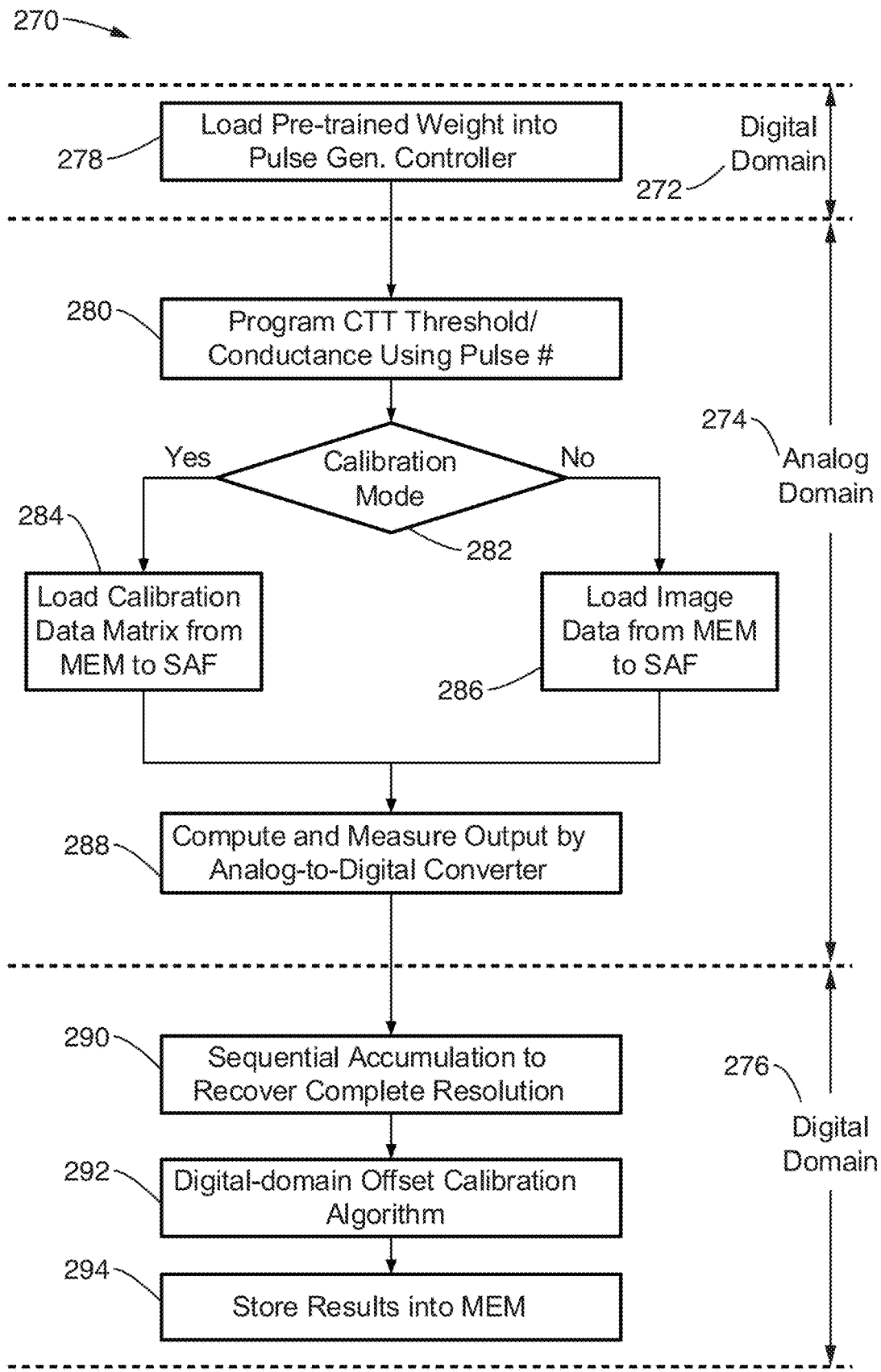
FIG. 7 is a flow diagram of computing engine operation according to an embodiment of the present disclosure.

FIG. 7 illustrates an example embodiment 270 of memristor computing engine operation, as performed through digital domain 272, analog domain 274 and final operations back in the digital domain 276.

The pre-trained weight values are loaded 278 (written) into the CTT array by counted pulse generators under the control of a pulse generator controller. The weight values are converted from the digital domain to represent 280 the conductance or threshold voltage of CTT devices. Each column of CTT drain voltages are connected together in order to reduce the hardware associated with the number of input ports. The drain voltage represents the neuron's value. To enable parallel neurons' computation, each neuron's value is decomposed into several bits and fed into the array in sequence, which will be handled by SAF block.

The calculation results are then sampled and fed into a calibration algorithm, in a process of calibration initialization. Before starting actual computation, a group of calibration data with known input values is loaded into the CTT array, based on the correct calculation results having already been stored in the digital domain. At block 282 it is determined which calibration mode is to be performed. Either block 284 is performed which loads calibration data matrix from MEM to SAF, or at block 286 loading image data from MEM to SAF.

At block 288 the output is computed and measured by the analog-to-digital converter (ADC). The first necessary operation in the digital domain 276 after ADC sampling is sequential accumulation 290 to sum all the decomposed bit components in SAF and recover complete results including the full resolution. The calculated partial summation of each bit accumulates together in the digital domain. In block 292 a digital domain offset calibration is performed with results being stored 294 into memory.

For a 784×784 CTT array, the weighted writing clock cycle number of the whole engine is equal to 784 times the longest pulse number, because 784-counted pulse generators program CTT devices column-by-column and the longest pulse number determines how fast one column of weight programming will be completed. As this process could be quite slow, an extra error-correction algorithm can be incorporated to maintain weight accuracy. Once programming is performed, those values are nonvolatile and forward propagation or inference speed is fast because of the fast reading features of the CTT device. Consequently, the described computing engine is primarily targeting at inference computation applications, rather than training process applications.

The computation throughput is able to achieve 76832 MACs per clock cycle. Equivalently, it is around 76.8 TOPS per second using a 500 MHz clock frequency.

5. Example of Handwritten Digit Classification

Figure 8:
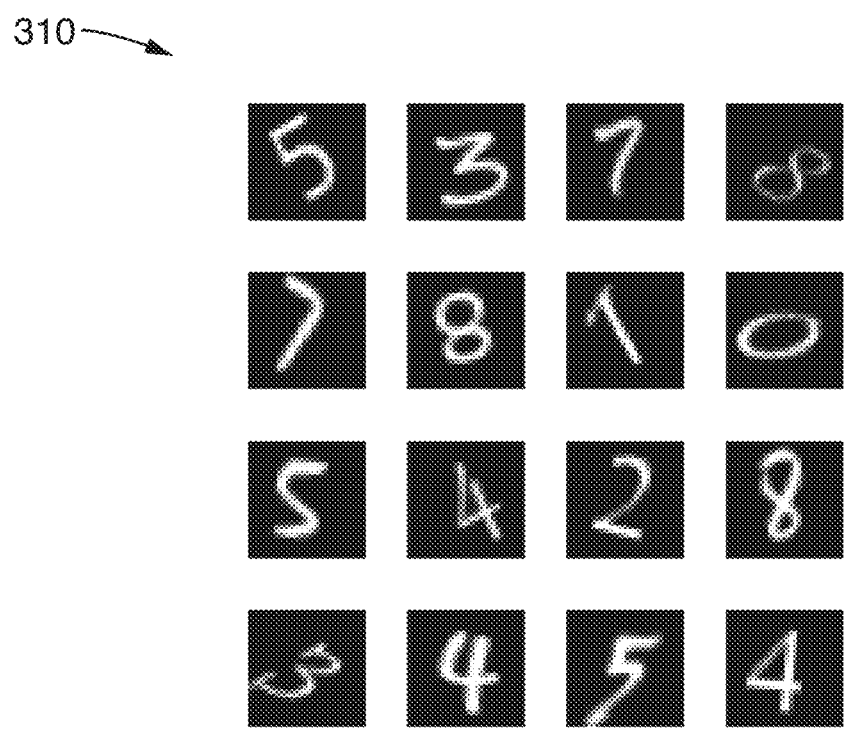
FIG. 8 are image samples from MNIST 28×28-pixel handwritten digit images which were utilized in performing digit recognition according to an embodiment of the present disclosure.

FIG. 8 illustrates an example embodiment 310 of 16 digit images (28×28-pixels) captured for testing the memristive neural network computing engine. Handwritten digit recognition is an important problem in optical character recognition, and it has been utilized as a benchmark for theories of pattern recognition and machine learning algorithms for many years. The freely available Modified National Institute of Standards and Technology database (MNIST) of handwritten digits, as seen in the figure, has become a standard for fast-testing machine learning algorithms for this purpose.

In testing the disclosed memristive neural network computing engine three different configurations of fully connected neural networks were utilized for solving the handwritten digits recognition problem. The number of array elements was chosen based on the 28×28-image size of these digits in the MNIST database. The CTT device model was utilized from experimental results in X. Gu et al., "Unsupervised Learning Using Charge-Trap Transistors", IEEE Electron Device Letters, Volume 38, Issue 9, September 2017, pp. 1204-1207, incorporated by reference herein. With mixed-signal analog-digital interfaces, the inter-layer partial results could be stored in any type of available memory system. Mixed signal analog-digital interfaces are necessary because digital-assistant calibration and optimization algorithms can be utilized seamlessly to guarantee analog computing accuracy. In this proof-of-concept prototype, the digital input and output data is conveniently stored in memory (e.g., hard drive) of a conventional computer and communicated with the neural engine circuit elements through a UART interface.

Figure 9:
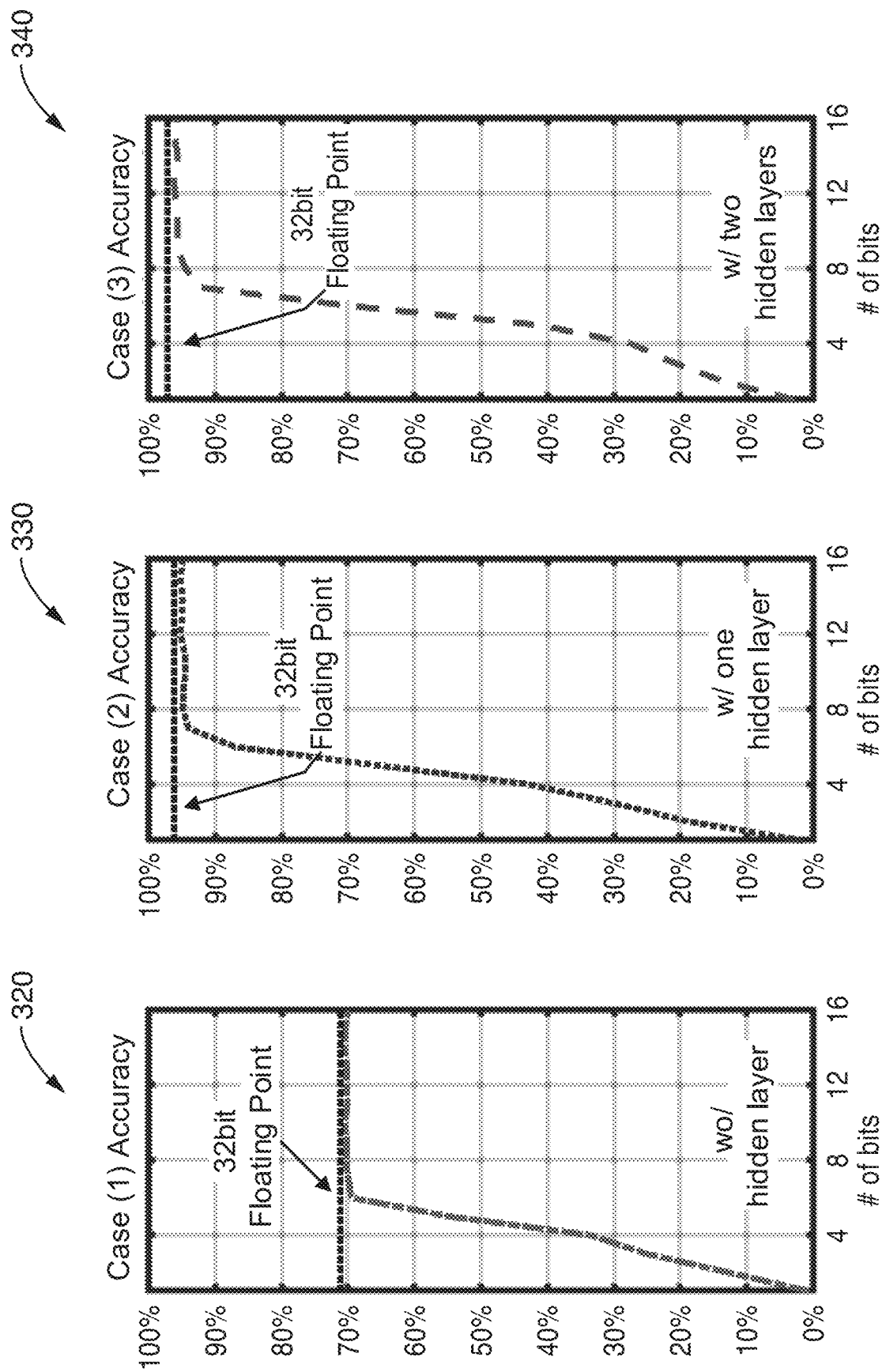
FIG. 9A through FIG. 9C are plots of accuracy versus resolution of analog-digital interface as determined according to an embodiment of the present disclosure.

FIG. 9A through FIG. 9C illustrate the results 320, 330, 340 from three different configurations of fully connected neural networks, which indicate the resolution of analog and digital interface impacts. A different number of bits are swept from 1 bit to 16 bits for three different network structures. The neural net for Case (1) in FIG. 9A was configured with two layers without a hidden layer; Case (2) in FIG. 9B was configured with three layers with 784 input neural cells, 300 cells in one hidden layer and 10 output cells; and Case (3) in FIG. 9C was configured with four layers with 784 input neural cells, 300 cells in the first hidden layer, 100 cells in the second hidden layer, and 10 output cells. These configurations achieved recognition accuracies of 69.8%, 94.2%, and 95.7%, respectively in Case (1), (2), and (3) using 16-bit fixed-point resolution on 10,000 testing images in MNIST database.

In the case of resolutions less than 5 bits, there were too many overflows and underflows, which resulted in a very low accuracy for all network configurations. However, in the case of resolution between 6 bits and 16 bits, the recognition accuracies are dramatically improved and comparable to using 32-bit floating-point data format.

If an 8-bit resolution is chosen as described in FIG. 1, more than 94% accuracy can be obtained in case (2) and (3). In all three cases, the accuracy difference between 32-bit floating-point and 8-bit fixed-point was found to be within 2%. Compared with 16-bit or 32-bit computation, the 8-bit resolution reduced the hardware overhead significantly at the cost of a small loss in accuracy.

6. Physical Design and Performance Summary

The exemplified memristive computing engine was implemented in TSMC 28 nm CMOS HPM standard VT technology, although one of ordinary skill in the art will appreciate that the teachings of the present disclosure can be implemented in a wide variety of technologies and scales. To evaluate the area, power and critical path of pulse generator and controller, register-transfer level (RTL) design was developed in Verilog®, which was then synthesized using a Synopsys® Design Compiler. The computing engine was placed and routed using Cadence® Innovus. The 8-bit ADC was implemented in a silicon-proof IP in the same technology. The dynamic and static power consumption was estimated by using Synopsys Prime Time. The other parts were designed and simulated in Cadence Virtuoso.

Figure 10:
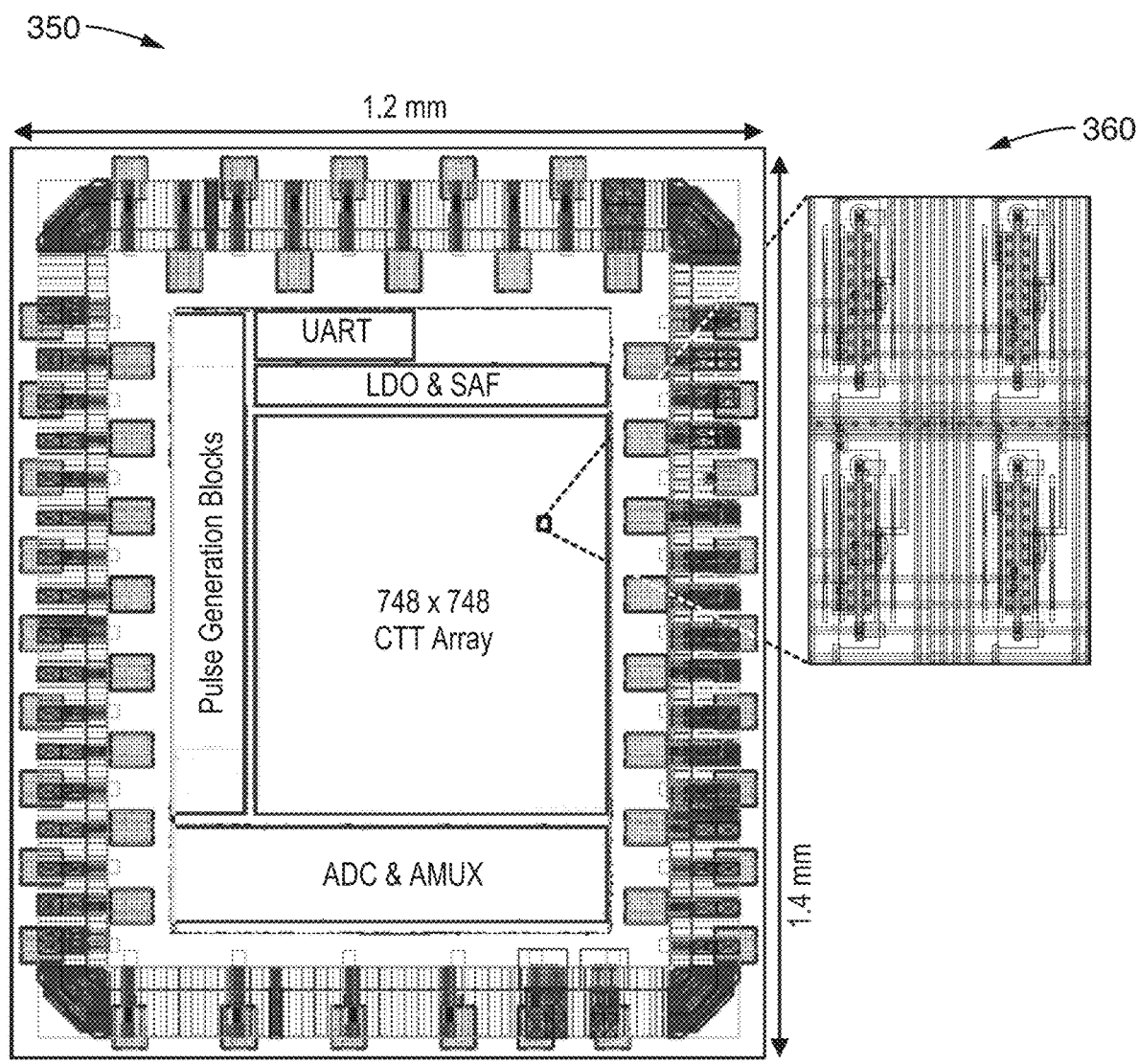
FIG. 10 is an image of a layout view in TSMC 28 nm CMOS technology of a memristive neural network computing engine utilizing CMOS-compatible charge-trap-transistors (CTTs) according to an embodiment of the present disclosure.

FIG. 10 illustrates an example embodiment 350 of the computing engine layout, in which the areas for UART, LDO and SAR, Pulse generation blocks, and 748×748 CTT array are seen. An exploded view of a CTT cell 360 from the 748×748 CTT array is seen in layout 350 as shown. The total core area of this computing engine is 0.68 mm$^2$ and area breakdown is as follows with CCT at 52.8%, pulse generation 12.5%, LDO and SAF 5.0%, UART 3.1%, ADC and AMUX 0.9% and other routing 25.8% of the entire area.

Table 2 compares the CTT engine with a pure digital computing engine in terms of process, area, power, clock speed, peak MAC numbers, and so forth. In sum, the CTT-based memristive computing engine occupies around 1/10 the area while providing more than 500 times the computational resources.

7. Deep Learning and Charge-Trap Transistor (CTT)

Deep neural networks show great promise in image, voice recognition and artificial intelligence applications. However, its commercial feasibility is hindered by one major problem; neural networks require huge computational resources (i.e., CPU, GPU, accelerators) even for very simple tasks. The density of on-chip memory and energy efficiency limit the computation of most major deep-learning accelerators.

7.1. Example of Charge Trap Transistor (CTT)

As an embedded non-volatile memory (eNVM) solution, the use of a Charge-Trap-Transistor (CTT) with high-k-metal-gate (HKMG) memory has attracted more attention recently, due to fast reading speed (~10 ns), low energy (~1 eV) and high-density (0.1 μm$^2$ cell size on 32 nm versus SRAM 0.3 μm$^2$ cell size on 28 nm).

Figure 11A:
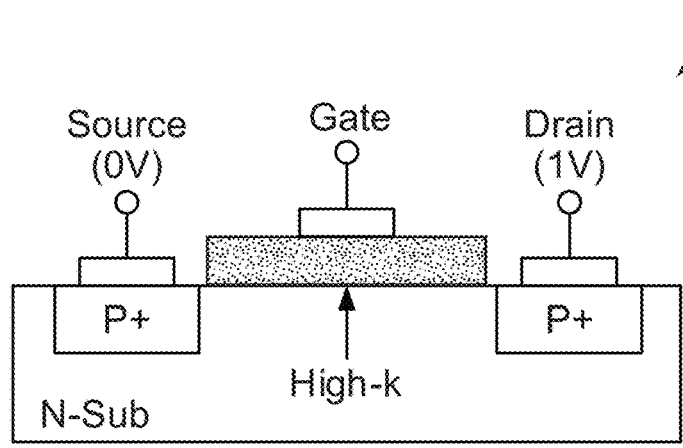
FIG. 11A through FIG. 11E are block diagrams of Charge-Trap-Transistor (CTT) memory operation, thresholds and architecture according to an embodiment of the present disclosure.
Figure 11B:
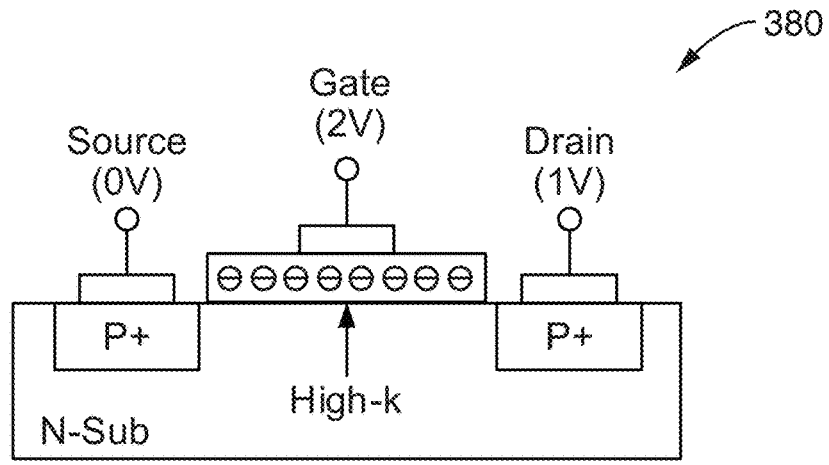
Figure 11C:
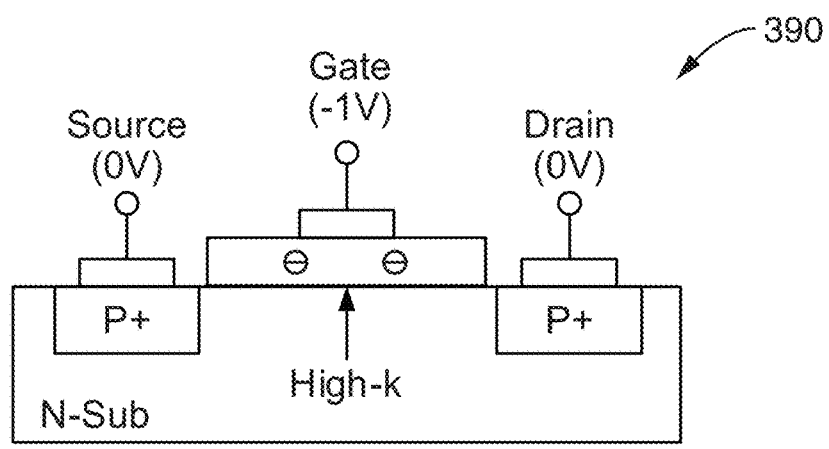

FIG. 11A through FIG. 11C illustrates an example embodiment of operating 370, 380, 390 a Charge-Trap-Transistor (CTT) Memory. It will be noted that the figures depict standard logic functions with each gate handling only one bit. It should be appreciated that CTT based computations are analog based, meaning that one CTT cell could compute multiples bits at one time. The according bit number is decided by the proceeding processing ADC resolution and the native CTT device noise level. FIG. 11B depicts a charge trapping state, while FIG. 11C depicts the charge de-trapping state, as was previously discussed in relation to FIG. 2A through FIG. 2D.

Figure 11D:
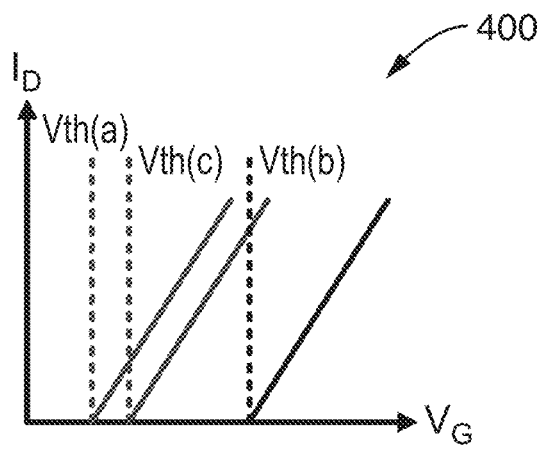
Figure 11E:
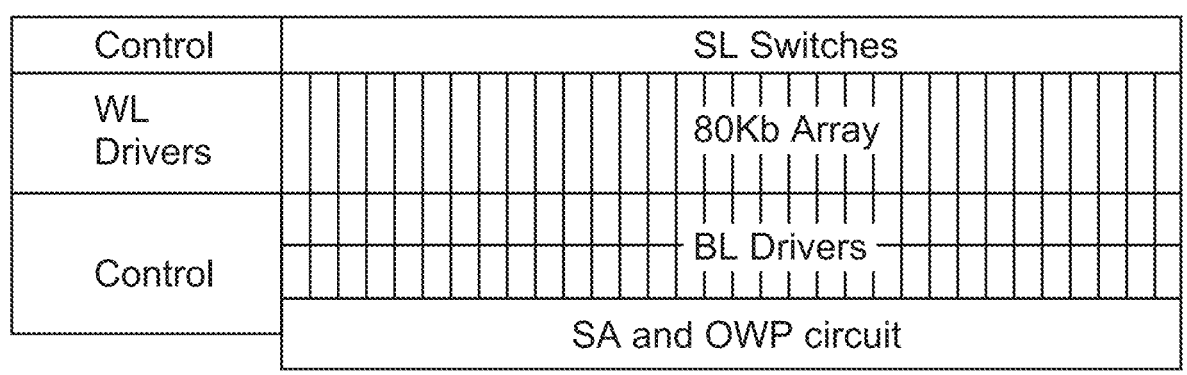

FIG. 11D illustrates an example embodiment 400 of the bit modulated threshold (weighting) which is achieved utilizing these devices.

FIG. 11 E illustrates an example embodiment 410 of an 80 kb CTT memory micro architecture, showing circuit sections for control, wordline (WL) drivers, source line (SL) switches, 80 kb array of CTT cells, Bit Line (BL) drivers, and sense amplifier (SA) and over-write protection (OWP) circuits.

Although the writing/erasing time of CTT memory is as slow as flash memory (~1 ms), in deep-learning accelerator applications where the on-chip data is highly reused, it only requires high-speed reading and tolerates much slower writing. More importantly, CTT memory can readily interoperate with computing logic cells because of its compatibility.

7.2. CNN Accelerator With CTT-Based eNVM

Figure 12A:
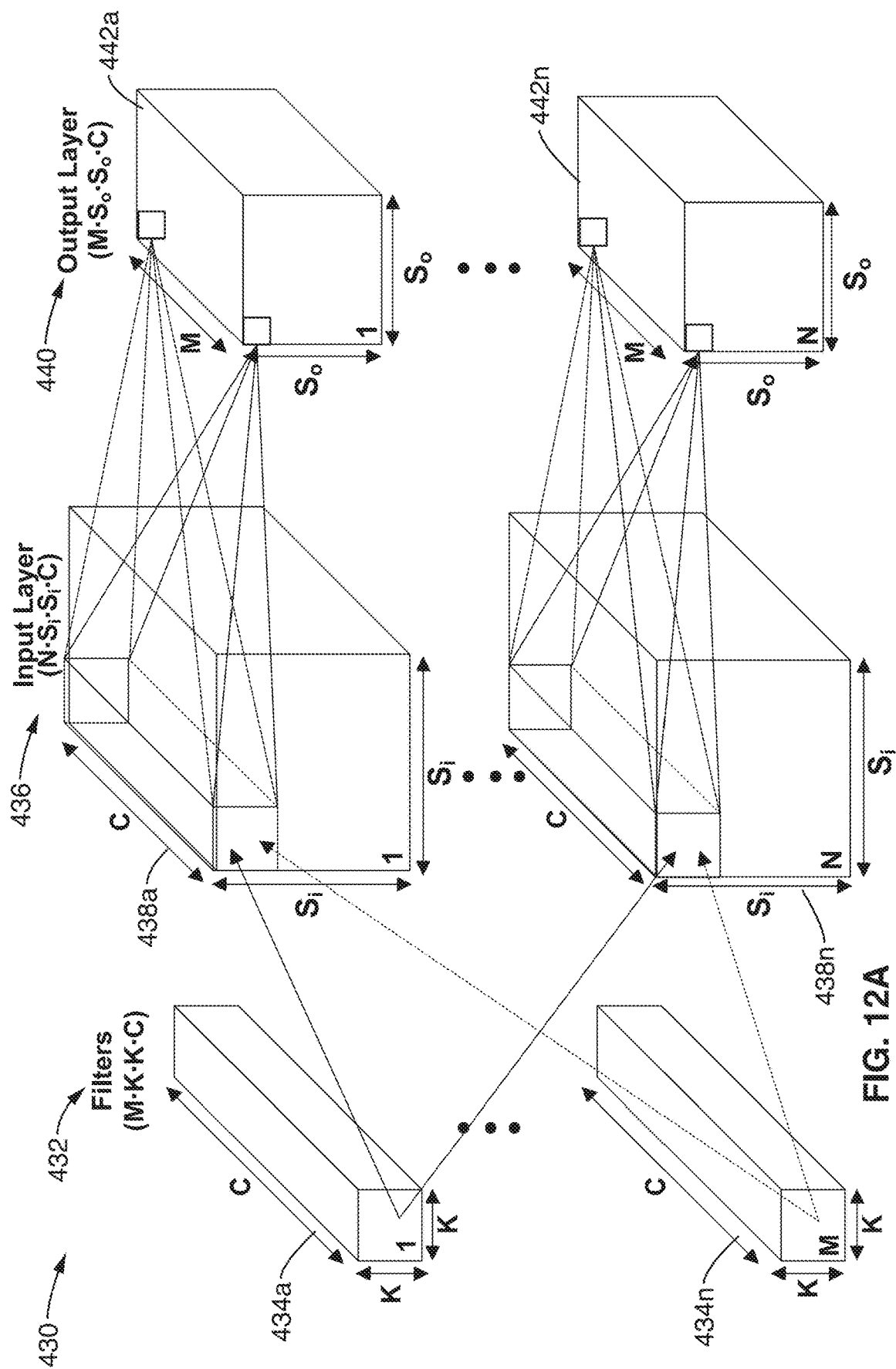
FIG. 12A and FIG. 12B are block diagrams of convolution layer and convolution unit example, such as utilized according to an embodiment of the present disclosure.
Figure 12B:
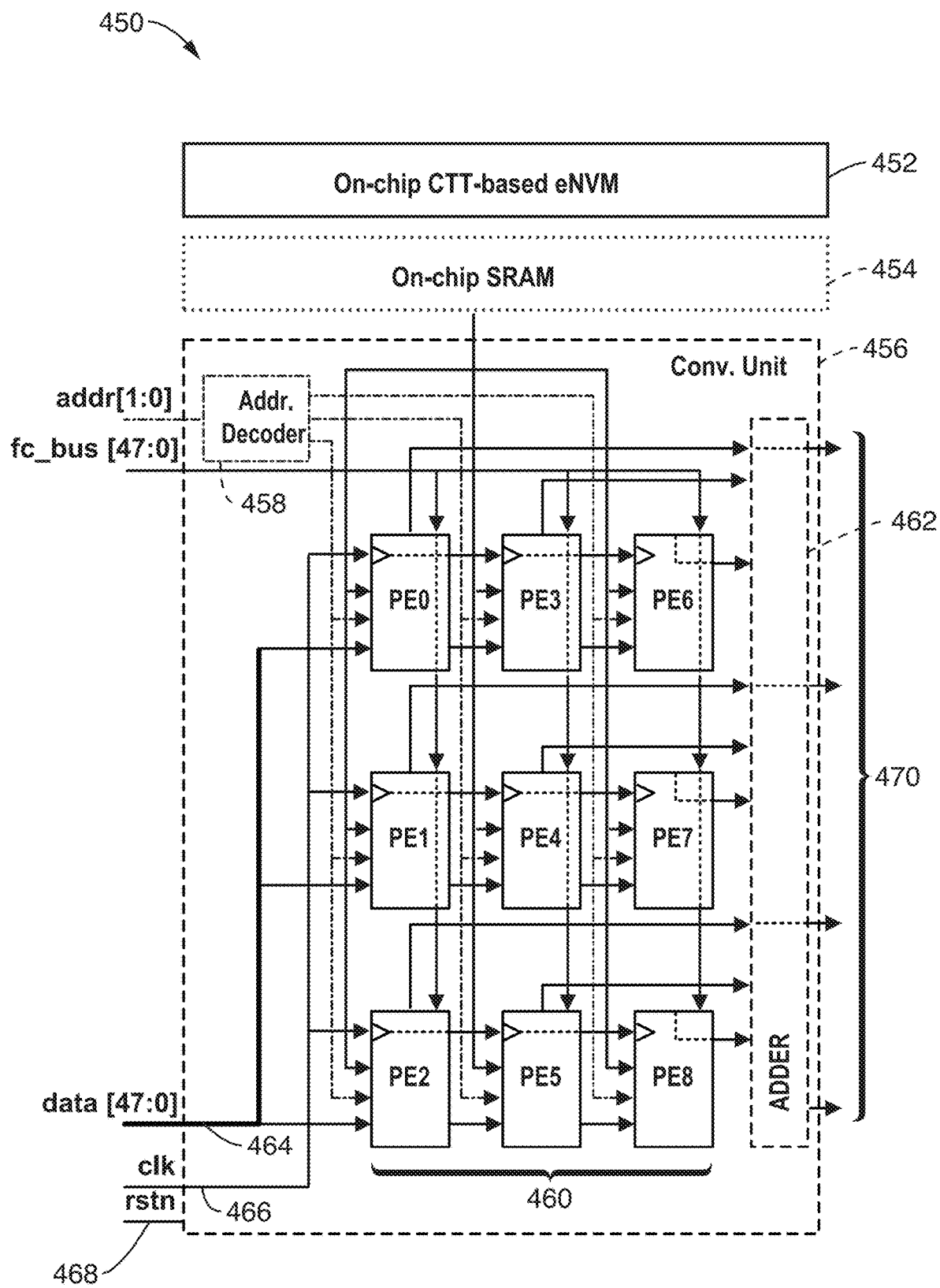

FIG. 12A and FIG. 12B illustrate an example embodiment of how a convolution layer operates showing one convolution layer 430, and of a convolution computation unit 450.

In FIG. 12A a convolution layer is depicted which applies convolution to convert the image/feature map of the input layer to the feature map of the next layer. Filters 432 (M•K•K•C) are seen 434a, 434b, associated with an input layer 436 (N•$S_i$•$S_i$•C) seen as 438a, 438b, and coupled to an output layer 430 (M•$S_o$•$S_o$•C) seen with 442a, 442b. It should be appreciated that in a convolutional neural network, units within a hidden layer are segmented into "feature maps" where the units within a feature map share the weight matrix, or simply stated 'look' for the same feature. Hidden units within a feature map are unique in that they are connected to different units in the lower layer.

In FIG. 12B is shown an example of a typical convolution computation unit 450 is seen as with on-chip CTT-based eNVM 452, On-chip SRAM 454, convolution unit 456 having an address decoder 458 receiving an address bus and fc_bus, which outputs to an array of convolution cells 460. Data 464, clk 466 signals are seen coupled to the convolution cells 460 with an negative reset (rstn) 468 signal coupled to the chip. Weighting of convolution cells 460 is controlled by data from the on-chip memory 454, and output is directed to adder 462 having outputs 470. The above can aid in understanding of the advantages of the present disclosure.

Since each input layer can have multiple features, the convolution is 4-D, as shown in FIG. 12A. Each filter or feature map can comprise a 3-D structure with multiple 2-D planes, with a group of 3-D feature maps multiplied by a group of 3-D filters and added by a 1-D bias vector. The computation of CONV layer is defined as:

$$O[o][m][x][y] = B[o] + \sum_{k=1}^{M}\sum_{i=1}^{K}\sum_{j=1}^{K} I[o][k][\alpha x + i][\alpha y + j] \times W[m][k][i][j]$$

where O, B, I and W are the output features, biases, input features, and filters, respectively. One interesting observation is that the filter coefficients stored in on-chip memory (e.g., SRAM) will be reused (read) many times to scan a whole frame of images. To fully utilize this feature, CTT-based eNVM with fast reading and slow writing can provide a beneficial mechanism for reaching improved (3×) density and lower (0.1×) power consumption.

7.3. Neuromorphic Computation With Multi-Gate CTT Devices

There are two general processes involved in an artificial neuron: (1) weighting of the input; and (2) non-linear function of the sum of the weighted inputs.

Figure 13A:
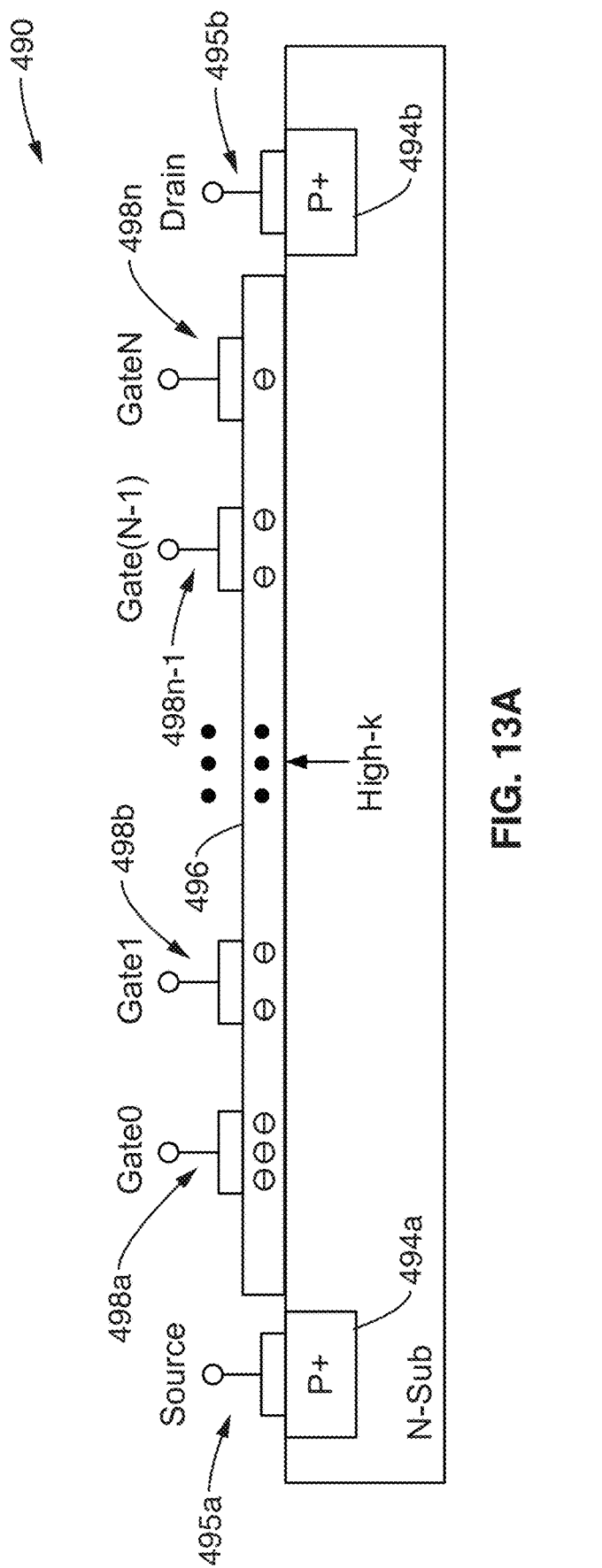
FIG. 13A and FIG. 13B are schematics of Neuromorphic Computation with Multi-gate CTT Device and its model according to an embodiment of the present disclosure.
Figure 13B:
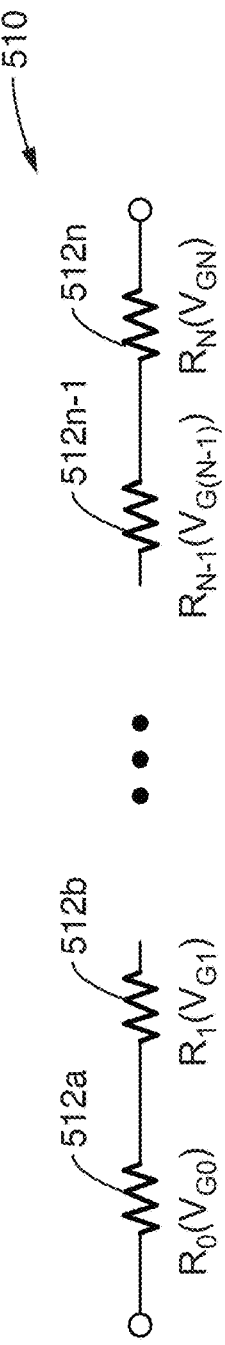

FIG. 13A and FIG. 13B illustrate an example embodiment 490, 510 of a multi-gate CTT device which can behave as an artificial neuron, such as utilized in circuits such as shown in FIG. 1, having gate voltages as inputs, and the charges under the gates providing the weighting to the inputs. In FIG. 13A an N substrate 492 is seen with P regions 494a, 494b, over which are source and drain electrodes 495a, 495b. A high-K dielectric 496 is over the channel region, over which are disposed a number of gates, exemplified as Gate0 498a, Gate1 498b, through to Gate(N−1) 498n−1 and GateN 498n.

In FIG. 13B the serial resistance 510 is seen as a non-linear summation of the input with resistances 512a, 512b, through to 512n−1 and 512n, similar to the output of a neuron, as shown in the following equation:

$$R_{total} = R_0(V_{G0}) + R_1(V_{G1}) + \ldots + R_N(V_{GN})$$

Therefore, by utilizing the charge-trap-transistor technique in the deep-learning hardware architecture field, novel low power, high-performance artificial-intelligence-related computing hardware can be achieved with increased levels of time and energy-efficiency.

8. Conclusion

The present disclosure has demonstrated that memristive computing engine with the disclosed CTT can be built, such as comprising a fully-CMOS-compatible non-volatile analog device, to calculate fully connected neural networks. The described architecture with novel mixed-signal analog-digital interfaces enables multi-layer fully connected neural network computation, and inter-layer partial calculation results can be flexibly stored in any type of available memory or processed with any calibration and optimization processes to guarantee analog computing accuracy. Implementation was exemplified with a 784×784 CTT array, that was tested in this disclosure on a handwritten digit recognition problem to achieve more than 95% accuracy using 8-bit fixed-point analog-digital interface.

Finally, a physical design was exemplified using standard TSMC HPM 28 nm PDK to estimate area and power consumption. Since high-k gate dielectrics are expected to be present in all current and future CMOS technology nodes, the integration of the described architecture with other functional components should be seamless. The teachings of this disclosure could aid development of ultra-large scale, low power, low cost and high performance CMOS intelligent systems.

9. General Scope of Embodiments

The enhancements described in the presented technology can be readily implemented to create neural computing engines. It should also be appreciated that neural computing engines are often interoperably coupled to one or more digital processors (e.g., CPU, microprocessor, microcontroller, computer enabled ASIC, etc.) and associated memory storing instructions (e.g., RAM, DRAM, NVRAM, FLASH, computer readable media, etc.) whereby programming (instructions) stored in the memory are executed on the processor to perform the steps of the various process methods and controls described herein.

One of ordinary skill in the art recognizes the use of computer devices for carrying out steps involved with cooperative control and processing of neural computation. The presented technology is non-limiting with regard to memory and computer-readable media, insofar as these are non-transitory, and thus not constituting a transitory electronic signal.

Embodiments of the present technology may be described herein with reference to flowchart illustrations of methods and systems according to embodiments of the technology, and/or procedures, algorithms, steps, operations, formulae, or other computational depictions, which may also be implemented as computer program products. In this regard, each block or step of a flowchart, and combinations of blocks (and/or steps) in a flowchart, as well as any procedure, algorithm, step, operation, formula, or computational depiction can be implemented by various means, such as hardware, firmware, and/or software including one or more computer program instructions embodied in computer-readable program code. As will be appreciated, any such computer program instructions may be executed by one or more computer processors, including without limitation a general purpose computer or special purpose computer, or other programmable processing apparatus to produce a machine, such that the computer program instructions which execute on the computer processor(s) or other programmable processing apparatus create means for implementing the function(s) specified.

Accordingly, blocks of the flowcharts, and procedures, algorithms, steps, operations, formulae, or computational depictions described herein support combinations of means for performing the specified function(s), combinations of steps for performing the specified function(s), and computer program instructions, such as embodied in computer-readable program code logic means, for performing the specified function(s). It will also be understood that each block of the flowchart illustrations, as well as any procedures, algorithms, steps, operations, formulae, or computational depictions and combinations thereof described herein, can be implemented by special purpose hardware-based computer systems which perform the specified function(s) or step(s), or combinations of special purpose hardware and computer-readable program code.

Furthermore, these computer program instructions, such as embodied in computer-readable program code, may also be stored in one or more computer-readable memory or memory devices that can direct a computer processor or other programmable processing apparatus to function in a particular manner, such that the instructions stored in the computer-readable memory or memory devices produce an article of manufacture including instruction means which implement the function specified in the block(s) of the flowchart(s). The computer program instructions may also be executed by a computer processor or other programmable processing apparatus to cause a series of operational steps to be performed on the computer processor or other programmable processing apparatus to produce a computer-implemented process such that the instructions which execute on the computer processor or other programmable processing apparatus provide steps for implementing the functions specified in the block(s) of the flowchart(s), procedure (s) algorithm(s), step(s), operation(s), formula(e), or computational depiction(s).

It will further be appreciated that the terms "programming" or "program executable" as used herein refer to one or more instructions that can be executed by one or more computer processors to perform one or more functions as described herein. The instructions can be embodied in software, in firmware, or in a combination of software and firmware. The instructions can be stored local to the device in non-transitory media, or can be stored remotely such as on a server, or all or a portion of the instructions can be stored locally and remotely. Instructions stored remotely can be downloaded (pushed) to the device by user initiation, or automatically based on one or more factors.

It will further be appreciated that as used herein, that the terms processor, hardware processor, computer processor, central processing unit (CPU), and computer are used synonymously to denote a device capable of executing the instructions and communicating with input/output interfaces and/or peripheral devices, and that the terms processor, hardware processor, computer processor, CPU, and computer are intended to encompass single or multiple devices, single core and multicore devices, and variations thereof.

From the description herein, it will be appreciated that the present disclosure encompasses multiple embodiments which include, but are not limited to, the following:

1. A neural network computing engine apparatus, comprising: an array of charge-trap-transistor (CTT) elements, each CTT element having a gate, a source, and a drain, in which said CTT elements are utilized as analog multipliers with all weight values preprogrammed into each CTT element as a CTT threshold voltage, with multiplicator values received from an inference of the neural network, wherein said array of charge-trap-transistor (CTT) elements perform computations of a fully connected (FC) neural network with each CTT element representing a neuron; a row resistor for each row of CTT elements for summing output currents of each row of CTT elements in said array of charge-trap-transistor (CTT) elements as partial summation results in said row resistor with output for each neural cell determined from voltages across row resistors; a plurality of counted pulse generators configured for writing weight values as controlled by a pulse generator controller, wherein said weight values are transferred from a digital domain as pulses from each of said plurality of counted pulse generators to an analog domain at a gate of each CTT in said array of charge-trap-transistor (CTT) elements to establish neuron weighting; an analog-to-digital converter (ADC) configured for reading partial summation results; and a sequential analog fabric (SAF) configured for feeding multiple drain voltages in parallel to said array of charge-trap-transistor (CTT) elements to enable parallel analog computations of neurons thereof and interfacing between an analog domain of said array of charge-trap-transistors (CTT) and a digital domain, in response to enabling parallel computation of multiple neurons.

2. The apparatus of any preceding or following embodiment, wherein said array of charge-trap-transistor (CTT) elements is reconfigurable and scalable for computing parallel multiple neuron values simultaneously.

3. The apparatus of any preceding or following embodiment, wherein each counted pulse generator of said plurality of counted pulse generators is coupled through a digital demultiplexor having multiple outputs, with each output coupled to the gate of one CTT element within a row of said array of charge-trap-transistor (CTT) elements.

4. A neural network computing engine apparatus, comprising: an array of charge-trap-transistor (CTT) elements, each CTT element having a gate, a source, and a drain, in which said CTT elements are utilized as analog multipliers with all weight values preprogrammed into each CTT element as a CTT threshold voltage, with multiplicator values received from an inference mode of the neural network, wherein said array of charge-trap-transistor (CTT) elements perform computations of a fully connected (FC) neural network with each CTT element representing a neuron; wherein said array of charge-trap-transistor (CTT) elements is reconfigurable and scalable for computing parallel multiple neuron values simultaneously; a row resistor for each row of CTT elements for summing output currents of each row of CTT elements in said array of charge-trap-transistor (CTT) elements as partial summation results in said row resistor with output for each neural cell determined from voltages across row resistors; a plurality of counted pulse generators configured for writing weight values as controlled by a pulse generator controller, wherein said weight values are transferred from a digital domain as pulses from each of said plurality of counted pulse generators to an analog domain at a gate of each CTT in said array of charge-trap-transistor (CTT) elements to establish neuron weighting; wherein each counted pulse generator of said plurality of counted pulse generators is coupled through a digital demultiplexor having multiple outputs, with each output coupled to the gate of one CTT element within a row of said array of charge-trap-transistor (CTT) elements; an analog-to-digital converter (ADC) configured for reading partial summation results; and a sequential analog fabric (SAF) configured for feeding multiple drain voltages in parallel to said array of charge-trap-transistor (CTT) elements to enable parallel analog computations of neurons thereof and interfacing between an analog domain of said array of charge-trap-transistors (CTT) and a digital domain, in response to enabling parallel computation of multiple neurons.

5. The apparatus of any preceding or following embodiment, wherein said apparatus is configured for use within a multilayer neural network structure.

6. The apparatus of any preceding or following embodiment, wherein said apparatus comprises a memristive neural network computing engine.

7. The apparatus of any preceding or following embodiment, wherein said sequential analog fabric (SAF) is configured for feeding multiple drain voltage in parallel using only one voltage reference.

8. The apparatus of any preceding or following embodiment, wherein each element of said array of charge-trap-transistors (CTT) is read with at least 4 bits or at least 8 bits.

9. The apparatus of any preceding or following embodiment, wherein said array of charge-trap-transistors (CTT) comprises from at least one hundred CTT elements, to millions of CTT elements.

10. The apparatus of any preceding or following embodiment, wherein said analog-to-digital converter (ADC) comprises a successive approximation register (SAR) form of ADC.

11. The apparatus of any preceding or following embodiment, wherein SAR ADC is configured for using sub-radix and a two-capacitor digital-to-analog converter (DAC) to provide over-range protection from capacitor mismatch and insufficient settling at an expense of one additional conversion cycle.

12. The apparatus of any preceding or following embodiment, wherein SAR ADC is configured with a comparator using a double-tail latch topology with an integrator followed by multiple differential pairs and a regenerative latch to accommodate a low supply voltage.

13. The apparatus of any preceding or following embodiment, wherein said apparatus is configured for being fabricated using conventional CMOS foundry processes.

14. The apparatus of any preceding or following embodiment, wherein said apparatus is configured for being embedded within a CMOS integrated circuit chip.

15. A method of performing neural network computing, comprising: connecting an array of charge-trap-transistor (CTT) elements as analog multipliers with all weight values preprogrammed into each CTT element as a CTT threshold voltage, with multiplicator values received from an inference of the neural network so that CTT elements perform computations of a fully connected (FC) neural network with each CTT element representing a neuron; summing output currents of each row of CTT elements in the array of charge-trap-transistor (CTT) elements as partial summation results in said row resistor with output for each neural cell determined from voltages across row resistors; writing weight values in response to counted pulse generators, wherein the weight values are transferred from a digital domain as pulses to an analog domain at a gate of each CTT in said array of charge-trap-transistor (CTT) elements to establish neuron weighting; reading partial summation results; and feeding multiple drain voltages in parallel to said array of charge-trap-transistor (CTT) elements to enable parallel analog computations of neurons thereof and interfacing between an analog domain of said array of charge-trap-transistors (CTT) and a digital domain, in response to enabling parallel computation of multiple neurons.

As used herein, the singular terms "a," "an," and "the" may include plural referents unless the context clearly dictates otherwise. Reference to an object in the singular is not intended to mean "one and only one" unless explicitly so stated, but rather "one or more."

As used herein, the term "set" refers to a collection of one or more objects. Thus, for example, a set of objects can include a single object or multiple objects.

As used herein, the terms "substantially" and "about" are used to describe and account for small variations. When used in conjunction with an event or circumstance, the terms can refer to instances in which the event or circumstance occurs precisely as well as instances in which the event or circumstance occurs to a close approximation. When used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" aligned can refer to a range of angular variation of less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Additionally, amounts, ratios, and other numerical values may sometimes be presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified. For example, a ratio in the range of about 1 to about 200 should be understood to include the explicitly recited limits of about 1 and about 200, but also to include individual ratios such as about 2, about 3, and about 4, and sub-ranges such as about 10 to about 50, about 20 to about 100, and so forth.

Although the description herein contains many details, these should not be construed as limiting the scope of the disclosure but as merely providing illustrations of some of the presently preferred embodiments. Therefore, it will be appreciated that the scope of the disclosure fully encompasses other embodiments which may become obvious to those skilled in the art.

All structural and functional equivalents to the elements of the disclosed embodiments that are known to those of ordinary skill in the art are expressly incorporated herein by reference and are intended to be encompassed by the present claims. Furthermore, no element, component, or method step in the present disclosure is intended to be dedicated to the public regardless of whether the element, component, or method step is explicitly recited in the claims. No claim element herein is to be construed as a "means plus function" element unless the element is expressly recited using the phrase "means for". No claim element herein is to be construed as a "step plus function" element unless the element is expressly recited using the phrase "step for".

TABLE 1

Multiply-Accumulate Operation Cost Summary

| Operation | Energy (pJ) | Area (um$^2$) |
|---|---|---|
| 8-bit ADD | 0.03 | 36 |
| 8-bit MULT | 0.2 | 282 |
| 8-bit MAC | 0.23 | 318 |
| 16-bit ADD | 0.05 | 67 |
| 16-bit MULT | 0.6 | 1652 |
| 16-bit MAC | 0.65 | 1719 |
| 16-bit FP ADD | 0.4 | 1360 |
| 16-bit FP MULT | 1.1 | 1640 |
| 16-bit FP MAC | 1.5 | 3000 |
| 32-bit ADD | 0.1 | 137 |
| 32-bit MULT | 3.1 | 3495 |
| 32-bit MAC | 3.2 | 3632 |
| 32-bit FP ADD | 0.9 | 4184 |
| 32-bit FP MULT | 3.7 | 7700 |
| 32-bit FP MAC | 4.6 | 12884 |

These cost values are for TSMC 40 nm CMOS technology.

TABLE 2

Performance Summary

| Merits | Conventional Digital | CTT Engine |
|---|---|---|
| Process | Standard 28 nm FD-SOI CMOS | Standard 28 nm CMOS |
| Core Area (mm$^2$) | 5.8 | 0.68 |
| Power (mW) | 41 | 14.8 |
| Clock Speed | 200-1175 MHz | 500 MHz |
| Peak MACs # | 0.64K | 76.8K |
| SRAM Size | 128 KB | 0 |
| Non-Volatile | No | Yes |

Only includes neural network computing engine.

What is claimed is:

1. A neural network computing engine apparatus, comprising:
an array of charge-trap-transistor (CTT) elements, each CTT element having a gate, a source, and a drain, in which said CTT elements are utilized as analog multipliers with all weight values preprogrammed into each CTT element as a CTT threshold voltage, with multiplicator values received from an inference of the neural network, wherein said array of charge-trap-transistor (CTT) elements perform computations of a fully connected (FC) neural network with each CTT element representing a neuron;
a row resistor for each row of CTT elements for summing output currents of each row of CTT elements in said array of charge-trap-transistor (CTT) elements as partial summation results in said row resistor with output for each neural cell determined from voltages across row resistors;
a plurality of counted pulse generators configured for writing weight values as controlled by a pulse generator controller, wherein said weight values are transferred from a digital domain as pulses from each of said plurality of counted pulse generators to an analog domain at a gate of each CTT in said array of charge-trap-transistor (CTT) elements to establish neuron weighting;
an analog-to-digital converter (ADC) configured for reading partial summation results; and
a sequential analog fabric (SAF) configured for feeding multiple drain voltages in parallel to said array of charge-trap-transistor (CTT) elements to enable parallel analog computations of neurons thereof and interfacing between an analog domain of said array of charge-trap-transistors (CTT) and a digital domain, in response to enabling parallel computation of multiple neurons.

2. The apparatus of claim 1, wherein said apparatus is configured for use within a multilayer neural network structure.

3. The apparatus of claim 1, wherein said apparatus comprises a memristive neural network computing engine.

4. The apparatus of claim 1, wherein said array of charge-trap-transistor (CTT) elements is reconfigurable and scalable for computing parallel multiple neuron values simultaneously.

5. The apparatus of claim 1, wherein each counted pulse generator of said plurality of counted pulse generators is coupled through a digital demultiplexor having multiple outputs, with each output coupled to the gate of one CTT element within a row of said array of charge-trap-transistor (CTT) elements.

6. The apparatus of claim 1, wherein said sequential analog fabric (SAF) is configured for feeding multiple drain voltage in parallel using only one voltage reference.

7. The apparatus of claim 1, wherein each element of said array of charge-trap-transistors (CTT) is read with at least 4 bits.

8. The apparatus of claim 1, wherein each element of said array of charge-trap-transistors (CTT) is read with at least 8 bits.

9. The apparatus of claim 1, wherein said array of charge-trap-transistors (CTT) comprises from at least one hundred CTT elements, to millions of CTT elements.

10. The apparatus of claim 1, wherein said analog-to-digital converter (ADC) comprises a successive approximation register (SAR) form of ADC.

11. The apparatus of claim 10, wherein SAR ADC is configured for using sub-radix and a two-capacitor digital-to-analog converter (DAC) to provide over-range protection from capacitor mismatch and insufficient settling at an expense of one additional conversion cycle.

12. The apparatus of claim 11, wherein SAR ADC is configured with a comparator using a double-tail latch topology with an integrator followed by multiple differential pairs and a regenerative latch to accommodate a low supply voltage.

13. The apparatus of claim 1, wherein said apparatus is configured for being fabricated using conventional CMOS foundry processes.

14. The apparatus of claim 1, wherein said apparatus is configured for being embedded within a CMOS integrated circuit chip.

15. A neural network computing engine apparatus, comprising:
an array of charge-trap-transistor (CTT) elements, each CTT element having a gate, a source, and a drain, in which said CTT elements are utilized as analog multipliers with all weight values preprogrammed into each CTT element as a CTT threshold voltage, with multiplicator values received from an inference mode of the neural network, wherein said array of charge-trap-transistor (CTT) elements perform computations of a fully connected (FC) neural network with each CTT element representing a neuron;
wherein said array of charge-trap-transistor (CTT) elements is reconfigurable and scalable for computing parallel multiple neuron values simultaneously;

a row resistor for each row of CTT elements for summing output currents of each row of CTT elements in said array of charge-trap-transistor (CTT) elements as partial summation results in said row resistor with output for each neural cell determined from voltages across row resistors;

a plurality of counted pulse generators configured for writing weight values as controlled by a pulse generator controller, wherein said weight values are transferred from a digital domain as pulses from each of said plurality of counted pulse generators to an analog domain at a gate of each CTT in said array of charge-trap-transistor (CTT) elements to establish neuron weighting;

wherein each counted pulse generator of said plurality of counted pulse generators is coupled through a digital demultiplexor having multiple outputs, with each output coupled to the gate of one CTT element within a row of said array of charge-trap-transistor (CTT) elements;

an analog-to-digital converter (ADC) configured for reading partial summation results; and a sequential analog fabric (SAF) configured for feeding multiple drain voltages in parallel to said array of charge-trap-transistor (CTT) elements to enable parallel analog computations of neurons thereof and interfacing between an analog domain of said array of charge-trap-transistors (CTT) and a digital domain, in response to enabling parallel computation of multiple neurons.

16. The apparatus of claim 15, wherein said apparatus is configured for use within a multilayer neural network structure.

17. The apparatus of claim 15, wherein said apparatus comprises a memristive neural network computing engine.

18. The apparatus of claim 15 wherein said sequential analog fabric (SAF) is configured for feeding multiple drain voltage in parallel using only one voltage reference.

19. The apparatus of claim 15, wherein each element of said array of charge-trap-transistors (CTT) is read with at least 4 bits or at least 8 bits.

20. The apparatus of claim 15, wherein said array of charge-trap-transistors (CTT) comprises from at least one hundred CTT elements, to millions of CTT elements.

21. The apparatus of claim 15, wherein said analog-to-digital converter (ADC) comprises a successive approximation register (SAR) form of ADC.

22. The apparatus of claim 21, wherein SAR ADC is configured for using sub-radix and a two-capacitor digital-to-analog converter (DAC) to provide over-range protection from capacitor mismatch and insufficient settling at an expense of one additional conversion cycle.

23. The apparatus of claim 22, wherein SAR ADC is configured with a comparator using a double-tail latch topology with an integrator followed by multiple differential pairs and a regenerative latch to accommodate a low supply voltage.

24. The apparatus of claim 15, wherein said apparatus is configured for being fabricated using conventional CMOS foundry processes.

25. The apparatus of claim 15, wherein said apparatus is configured for being embedded within a CMOS integrated circuit chip.

26. A method of performing neural network computing, comprising:

connecting an array of charge-trap-transistor (CTT) elements as analog multipliers with all weight values preprogrammed into each CTT element as a CTT threshold voltage, with multiplicator values received from an inference of the neural network so that CTT elements perform computations of a fully connected (FC) neural network with each CTT element representing a neuron;

summing output currents of each row of CTT elements in the array of charge-trap-transistor (CTT) elements as partial summation results in said row resistor with output for each neural cell determined from voltages across row resistors;

writing weight values in response to counted pulse generators, wherein the weight values are transferred from a digital domain as pulses to an analog domain at a gate of each CTT in said array of charge-trap-transistor (CTT) elements to establish neuron weighting;

reading partial summation results; and feeding multiple drain voltages in parallel to said array of charge-trap-transistor (CTT) elements to enable parallel analog computations of neurons thereof and interfacing between an analog domain of said array of charge-trap-transistors (CTT) and a digital domain, in response to enabling parallel computation of multiple neurons.

* * * * *